(12) United States Patent
Bechtel et al.

(10) Patent No.: US 7,599,134 B2
(45) Date of Patent: *Oct. 6, 2009

(54) VISION SYSTEM

(75) Inventors: Jon H. Bechtel, Holland, MI (US);
Harold C. Ockerse, Holland, MI (US);
Darin D. Tuttle, Byron Center, MI (US);
Spencer D. Reese, Auburn, IN (US);
Joel A. Stray, Hudsonville, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/180,762

(22) Filed: Jul. 28, 2008

(65) Prior Publication Data

US 2009/0040629 A1 Feb. 12, 2009

Related U.S. Application Data

(62) Division of application No. 11/726,638, filed on Mar. 22, 2007, now Pat. No. 7,423,821.

(60) Provisional application No. 60/785,595, filed on Mar. 24, 2006.

(51) Int. Cl.
*G02B 9/00* (2006.01)
*G02B 7/02* (2006.01)
*H04N 5/225* (2006.01)

(52) U.S. Cl. .................. 359/796; 348/340; 359/811
(58) Field of Classification Search ............... 348/340; 359/793, 794, 795, 796, 797, 811
See application file for complete search history.

(56) References Cited

U.S. PATENT DOCUMENTS

| 6,650,487 | B2 | 11/2003 | Mori |
| 6,816,322 | B2 | 11/2004 | Abe et al. |
| 7,423,821 | B2 * | 9/2008 | Bechtel et al. ............. 359/796 |
| 2005/0007481 | A1 | 1/2005 | Yamaguchi et al. |
| 2006/0119959 | A1 | 6/2006 | Yamaguchi et al. |

* cited by examiner

*Primary Examiner*—David N Spector
(74) *Attorney, Agent, or Firm*—Price, Heneveld, Cooper, DeWitt & Litton, LLP

(57) ABSTRACT

The present invention relates to improved optical structures, related manufacturing processes and assemblies incorporating the improved optical structures. In at least one embodiment accurate light source color information is provided throughout substantially the entire associated field of view.

20 Claims, 20 Drawing Sheets

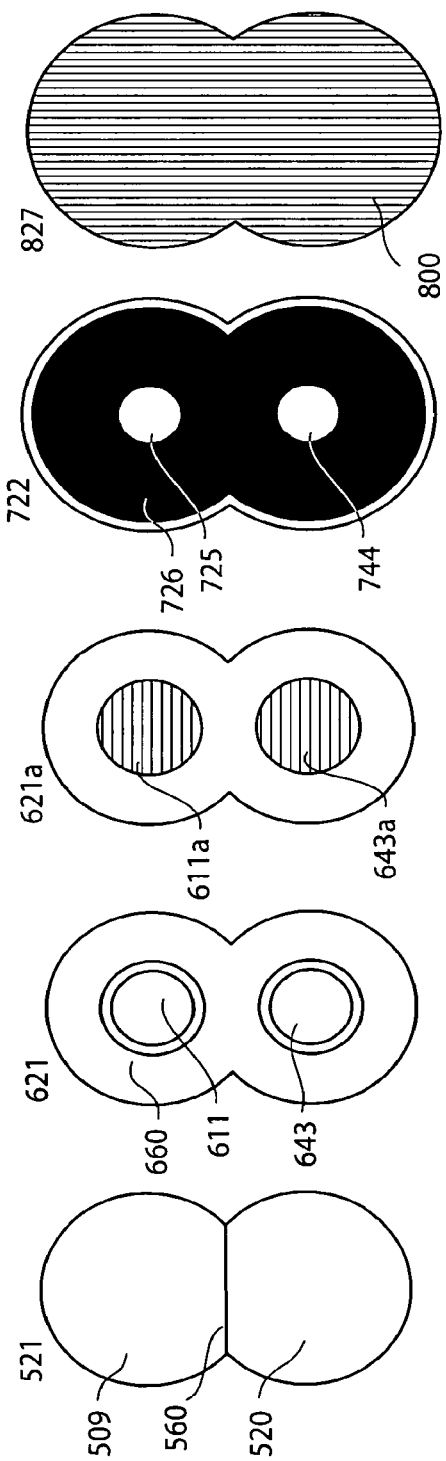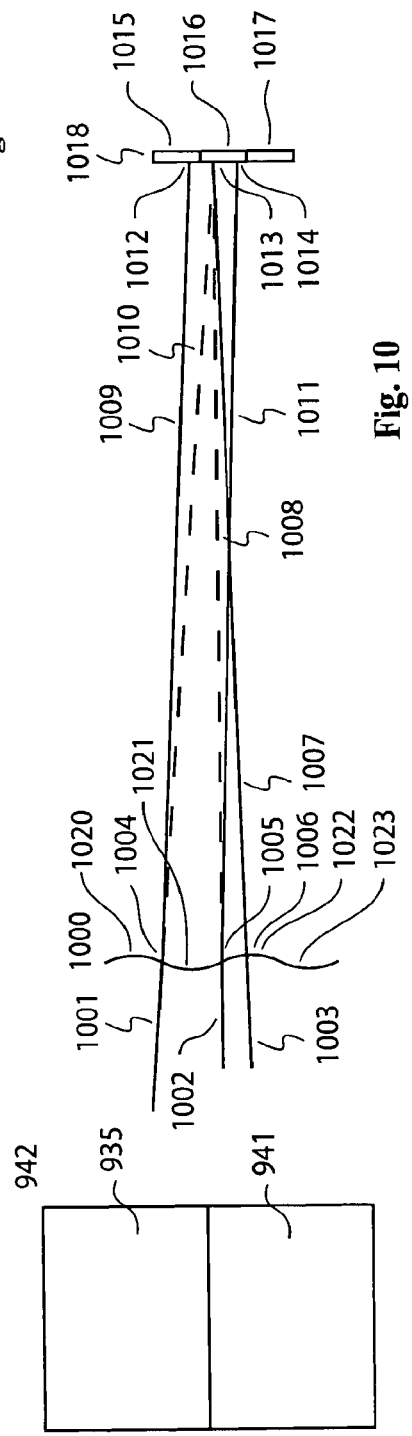

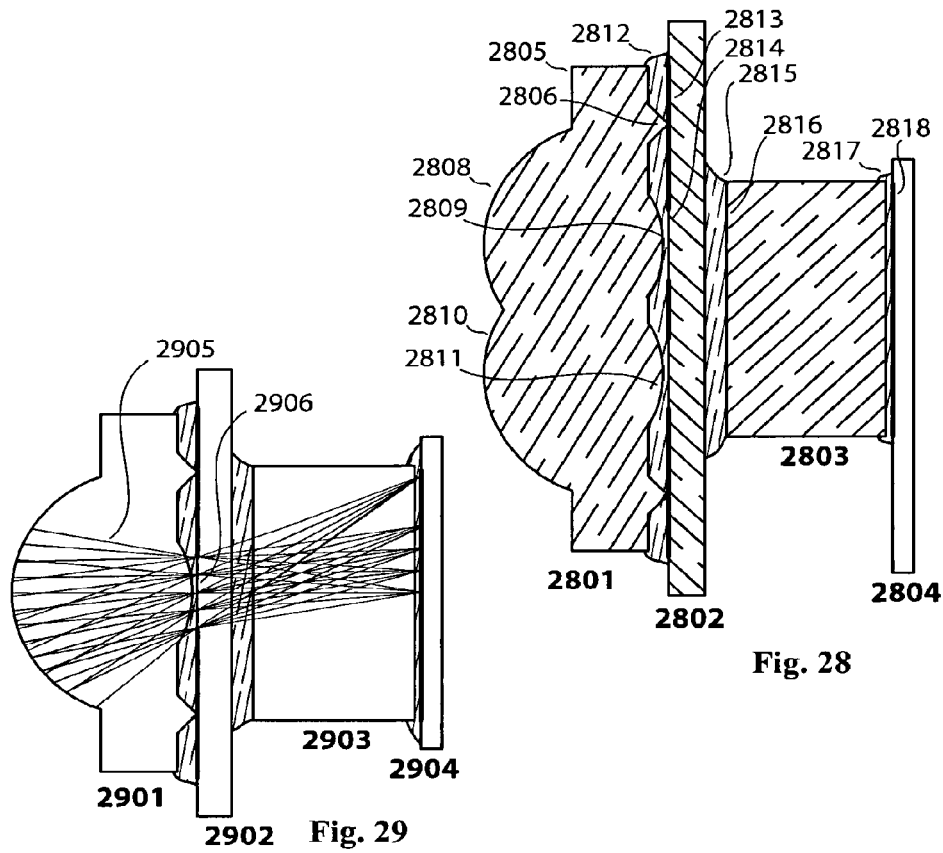
Fig. 28
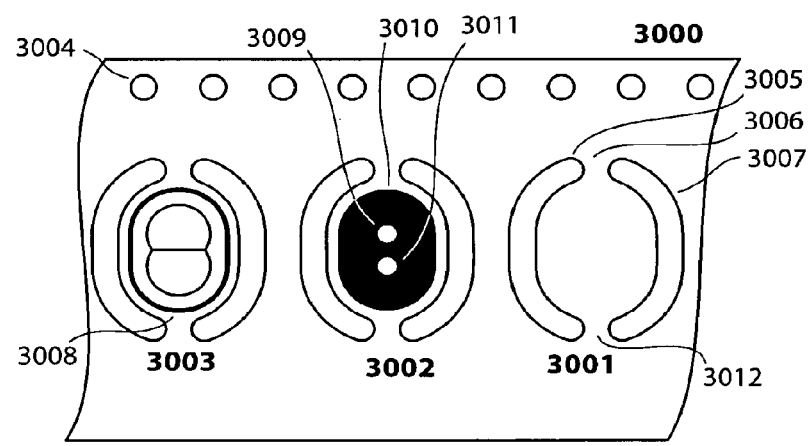
Fig. 29
Fig. 30

VISION SYSTEM

CROSS REFERENCE TO RELATED APPLICATIONS

This application is a divisional of U.S. patent application Ser. No. 11/726,638 filed on Mar. 22, 2007 now U.S. Pat. No. 7,423,821, by Jon H. Bechtel et al., which claims priority under 35 U.S.C. §119(e) to U.S. Provisional Patent Application No. 60/785,595, filed on Mar. 24, 2006, by Jon H. Bechtel et al., the entire disclosures of which are hereby incorporated herein by reference.

BACKGROUND OF THE INVENTION

The present invention relates to improved optical structures, related manufacturing processes and assemblies incorporating the improved optical structures. In at least one embodiment accurate light source color information is provided throughout substantially the entire associated field of view.

BRIEF DESCRIPTION OF THE FIGURES

FIGS. 5-10 depict various embodiments of improved optical structures;

FIGS. 28 and 29 depict various views of an image sensor having an improved optical structure;

FIG. 30 depicts an embodiment of an improved optical structure with a lens and an aperture mask;

DETAIL DESCRIPTION OF THE INVENTION

Figure 1:
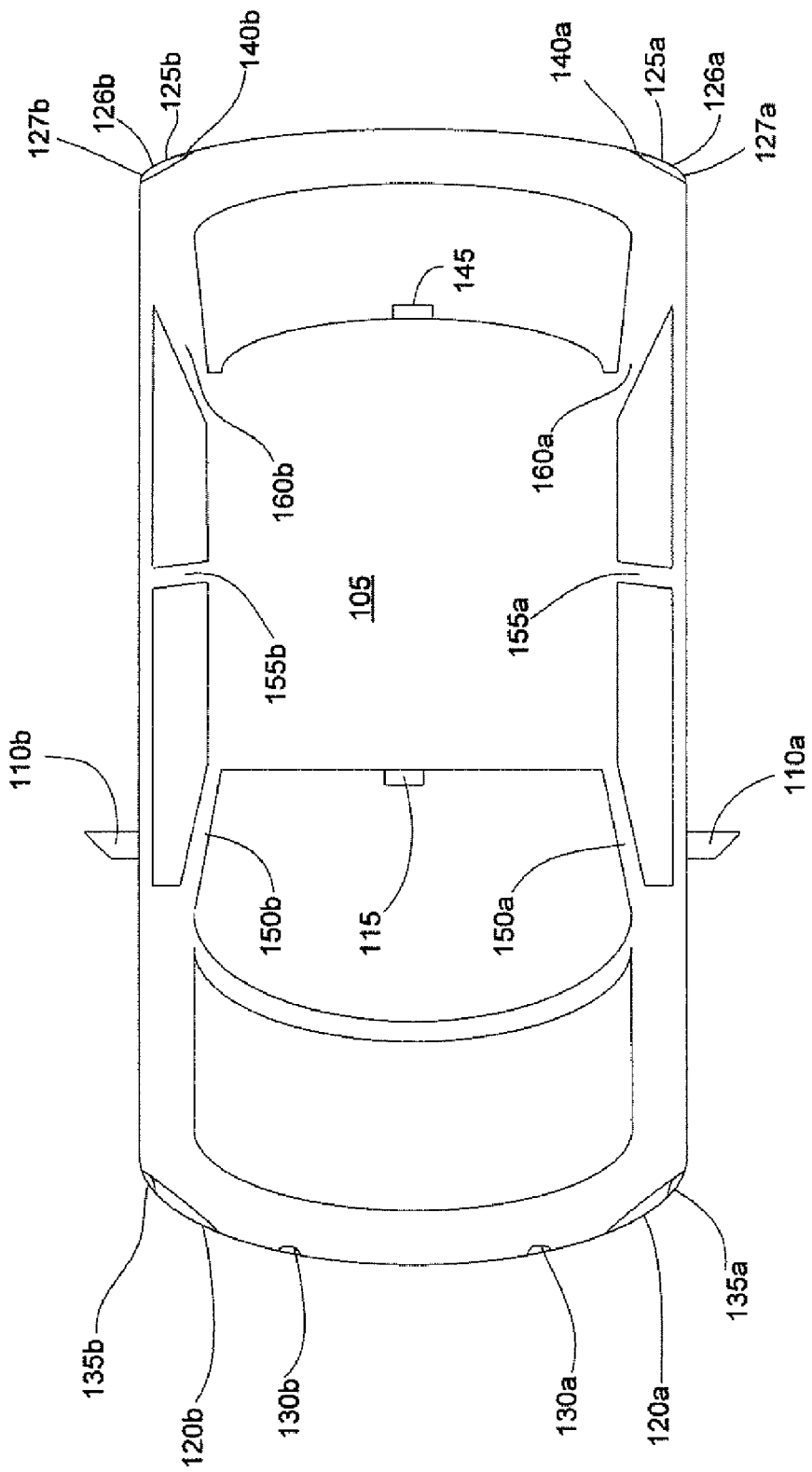
FIG. 1 depicts a controlled vehicle comprising a vision system having an improved optical structure.

With digital image sensors, good optical designs make it possible to approach the ideal of fully utilizing each pixel in the imaging array. By comparison, when optical quality is compromised, it is easy to fall into a trap where practices such as averaging of readings of many neighboring pixels are used to overcome flaws in the optical system. With a better optical system, the same information might be more accurately obtained from calculations involving much smaller groups of pixels or even from individual pixels. Compromises made to compensate for limitations in optical performance often result in the use of much higher pixel counts than would otherwise be required. Higher pixel counts not only increase the cost of the imager but also the cost of the extra memory and processing power required to process larger volumes of data.

The exemplary designs of this invention contain a number of significant improvements on features already covered in many of the commonly assigned patents and patent applications incorporated by reference elsewhere herein. The improvements include a dual element lens structure which substantially improves color correction and resolution while significantly expanding the angular field of view for which the image quality remains high. A preferred embodiment utilizes a close spaced pair of dual multi element compound lens systems which are arranged in a novel, economical configuration. A preferred design also includes one or more lens surfaces which spread or smear the projected image by a predetermined amount. It is preferable to smear or diffuse uniformly and to set the width of the smear to approximately equal the pitch or center to center spacing of the pixels measured in the direction of the smear. An improved filter arrangement which includes a red filter and an approximately red complement filter is used. The pair of filters is incorporated on the cover glass or glasses which also serve as the protective cover window for the imaging array as part of a durable, reasonably priced packaging construction.

The technique for providing controlled diffusion or smearing may also be extended to lens systems in which a single image is projected on a color filter array. In this case, as also covered generally in many of the commonly assigned patents and patent applications incorporated by reference elsewhere herein, the controlled smearing is extended to cover an approximately integral number of pixels where this number is greater than one in at least one direction.

Many of the construction features of the paired compound lens systems of this invention are also applicable to single as well as to multiple lens structures and as such, these single and plural compound lens systems are considered part of this invention.

In what follows, though the convention may not be adhered to with complete rigidity, the term lens system will normally refer to a complete optical structure for focusing a single image for the intended application and the term lens element will generally refer to a single piece of optical material normally having one or possibly two active lens surfaces on a common optical axis. The term compound lens or compound lens system will be used to refer to lens systems which have two or more active lens elements which are generally aligned on an optical axis to operate in cascade or successively on light rays which pass through them. In some of the embodiments, a single piece of plastic or other optical material may embody multiple lens elements where, for example, one of the elements may serve as a lens element in a first compound lens system and the second may serve a similar function as a lens element in a second compound lens system. In certain embodiments of the invention, two similar compound lens systems are employed with each used to project its own separate image of the scene. The first of these lens systems projects its image through the first of two differentiated color filters onto a first area of the image sensing array and the second of these compound lens systems projects its image through the second of two differentiated color filters onto a second area of the image sensing array, the first and second imaging areas being substantially non overlapping. It should be understood that embodiments of the present invention having a first lens element and a second lens element in direct contact with one another there is no interposing material, such as, a glue layer, an air gap or any other interposing material.

The improvement in resolution and the expanded angle of view are particularly needed for applications where the field of view of the imager is expanded so that the same camera can be used interchangeably in a variety of vehicles requiring automatic adaptation to a range of optical alignments. For example, in lane departure and headlamp dimming applications, the camera is often mounted to the windshield so that the angle of the windshield determines the angle at which the camera is mounted while the required field of view is primarily determined by the orientation of the camera relative to the horizontal center axis of the vehicle. To provide the added flexibility, the field of view of the camera needs to be expanded to include this range of angular differences between the camera mounting position and the horizontal center axis of the vehicle for the vehicle models in which the camera is intended to operate. Improved lens system resolution and color correction have many other benefits. These include making the lens systems useful for imaging arrays with higher pixel counts. Accuracy in measuring the intensity of light sources is improved as is the ability to determine color and to resolve objects and light sources in the scene.

The close proximity of the lens systems which are used for the dual image embodiments adds to the challenge of providing a multi-element compound lens structure. One of the structures thought to be novel is the dual compound lens structure which projects dual, approximately matching, color differentiated images on nearly adjacent but substantially non overlapping areas of the image surface or surfaces of a single imaging device, each of the two compound lens systems including at least a first and second lens element each of which has at least one substantially non planar lens surface which acts in conjunction with at least one other lens element to focus the light passing through the lens, the first and second lens elements being made of different lens materials. These two lens materials preferably have differing dispersions or Abbé numbers (For wavelength in nm and index of refraction n, the Abbé number may be defined as $(n_{589.2}-1)$ $(n_{486.1}-n_{656.3}))$ which are preferably utilized in the lens structure to improve color correction. It is further preferable to arrange the lens surfaces and characterize the design so that the lens aberrations are held to an acceptably low level over an increased angular field of view. Designs were investigated placing the lens element with the lower dispersion, higher Abbé number material, on the scene side and placing the lens element with the higher dispersion, lower Abbé number material, on the imager side. It was discovered that for these designs with the lower dispersion, higher Abbé number, lens material on the scene side, the combination of reasonable color correction and increased angular field of view was best obtained when the thickness of the lens element having the lower dispersion, higher Abbé number, lens material on the scene side was somewhat greater than the radius of the scene side surface of this lens element. Since the quality of the lens system performance, particularly with regard to the performance over an expanded field of view is quite sensitive to lens element thickness, it is advisable to experiment with a relatively large range of lens element thicknesses. Furthermore, surfaces of this lens element are preferably convex both on the scene side and the imager side of the lens element.

For designs with the lens element with the higher dispersion, lower Abbé number material, on the scene side and the lens element with the lower dispersion, higher Abbé number material, on the imager side, it was discovered that the combination of reasonable color correction and increased angular field of view was best obtained when the thickness of the lens element having the higher dispersion, lower Abbé number, lens material on the scene side was significantly smaller than the radius of the scene side surface of this lens element. Furthermore, the surface on the scene side of this lens element is preferably convex and the surface of this lens element on the imager side is preferably concave. In a preferred embodiment of this configuration, the scene side lens element is molded and incorporated with a second member which is preferably opaque and which preferably serves as the primary aperture stop in the lens system. The combination of the lens element and this second piece form a cavity into which a transparent hardenable material is dispensed and hardened thereby casting the second lens element in place. An optional modification of the above structure is to combine the lens element and preferably opaque second member into one preferably transparent piece and to print the preferably opaque aperture stop onto the lens structure or to use a second, preferably opaque, member as the aperture stop. The cavity in the molded lens element structure then serves as a potting cup to hold and contain the material which serves as the second lens element of the compound lens system.

Another feature of preferred structures of this invention is that for at least one and preferably both of the two lens element materials, corresponding lens elements for the two adjacent, compound, lenses are molded in a common piece with the piece configured to span the two compound lens structures so that each compound lens uses one of the two elements which are molded into the common piece. Furthermore, one of the two pairs of similar lens elements is preferably molded such that active portions of the lens surfaces are physically close to or preferably adjoin one another over an appreciable distance.

In several of the preferred structures, two active lens element surfaces for each of two or more compound lenses which are provided in the structure are molded or otherwise formed in a common piece of plastic or other transparent material and a second lens element material with different optical characteristics is cast in place so that it conforms to and preferably also adheres to one of the active lens surfaces for each of the compound lenses. In each of the two preferred structures, the second lens element material which is cast in place has properties which make it effective to improve color correction of the compound lens system. Furthermore, the total system is effective to substantially improve off axis performance of the lens system.

In one of the above mentioned structures, an opaque member or optionally the cavity which is integrally molded with the first lens (In which case, the stop is preferably formed by an additional member or printed layer) functions to contain the lens element material which is cast in place until it solidifies and preferably also serves as the stop or aperture for the lens system.

In another of the above mentioned structures, the stop or aperture is preferably applied as a substantially opaque layer, which is preferably minimally reflecting and which has the required transparent aperture openings. The area to which the stop is applied is preferably an approximately flat surface of a transparent substrate material. The second lens element material which is cast in place is then used to cement the piece of plastic or other transparent material into which the two lens surfaces are molded to the substrate containing the aperture so that the material which is cast in place conforms to at least one lens surface so that it serves as the second lens material of a compound lens as described above and it also serves to attach the plastic lens to the surface with the aperture coating. This second lens material is preferably applied so that it provides an uninterrupted optical path between at least one lens surface on the part which is preferably molded and the preferably flat surface having the aperture mask. The lens is preferably aligned to the aperture mask during the placement and gluing process. This configuration has several features which facilitate its construction. First, multiple aperture patterns (for example, 1000 or so) may be printed on a common transparent substrate which may be cut apart into separate blocks either before or after the lens structures are cemented to it. Second, for a typical application the lenses are small enough that microelectronic assembly and processing equipment may be adapted to perform the manufacturing steps. A saw similar to those designed to dice silicon wafers may be adapted to cut the substrate material (particularly when glass is used for the substrate material) into separate lens components. Die placement equipment may be used to handle the pieces having the lens surfaces and the substrate pieces with the aperture masks, apply the glue, align, and cement the lenses to the substrate which preferably includes the aperture mask. Wafer tape and wafer frames may be used to hold the substrate pieces and attached lenses during the sawing and lens placement processes. The wafer tape and frames may also serve to hold completed lens assemblies until they are removed for placement in the camera structure.

The camera based pattern recognition system which is normally used as part of the microelectronic alignment and placement system can be modified to properly align the lens to the aperture mask.

In an alternate, third, construction, the aperture mask may be applied to the back surface of the lens element which is closest to the scene, preferably by a printing process such as pad printing. When the associated lens surface is concave and the area which adjoins the edges of the lens surface in the lens surface is preferably approximately flat, a substantially flat printing pad may be used and the printing process may be configured to cover the area surrounding the lens and preferably also the edge of the lens surface as it adjoins the surrounding surface without requirement for a precise alignment step. Thus, the critical alignment of the aperture mask to the lens surface and the preferable masking of the outer edge of the lens surface are accomplished in a process which is self aligning. In an exemplary design which has a convex lens surface adjoining the glue layer, a flat printing pad was found to be flexible enough to yield to conform to the modest protrusion of the convex lens surface so that the aperture may be successfully printed using a pad printing process. A cleaning step using a solvent such as alcohol may be needed prior to the gluing operation to clean residue which may be transferred from the printing pad or cliché to the lens surface. Ion bombardment using materials such as oxygen or argon may also be used to remove very thin films and to alter surface properties to promote glue adhesion.

Many of the glue formulations were found to have a greater change in refractive index with changes in temperature than the molded plastics such as polycarbonate, acrylic, or cyclic olefin copolymers.

Changes in index of refraction caused by changes in temperature or other environmental variables are often in the same direction but greater for many of the glues available for formation of lens elements than for available thermoplastic lens materials or other lens materials such as glass. In some of the exemplary lens structures this undesirably increases the shift in focal length of the composite lens system due to changes in the selected environmental variables while, for others, it has a compensating effect serving to reduce the changes in focal length of the lens system with changes in the selected environmental variables.

Properties which characterize a lens system for which the shift in focal is increased by the greater shift in index of the glue caused by changes in the selected environmental variables are as follows. The system has a first lens on the scene side of the lens system. The system also has a second lens element formed by a glue layer which adjoins the first lens element on the side opposite the scene. The Abbé number of the second lens formed by the glue is higher than the Abbé number of the first lens element and the shift in index of refraction of the second lens element relative to the first due to changes in a selected environmental parameter such as temperature or humidity is of the same sign but greater in magnitude for the second lens element than for the first. The first lens element further has a concave, negative, lens surface which adjoins the mating convex, positive, lens surface of the second lens element.

Properties which characterize a lens system for which the shift in focal is decreased and thereby may have a partially compensating effect due to the greater shift in index of the glue caused by changes in the selected environmental variables are as follows. The system has a first lens on the scene side of the lens system. The system also has a second lens element formed by a glue layer which adjoins the first lens element on the side opposite the scene. The Abbé number of the second lens formed by the glue is lower than the Abbé number of the first lens element and the shift in index of refraction of the second lens element relative to the first due to changes in an environmental parameter such as temperature or humidity is of the same sign but greater in magnitude for the second lens element than for the first. The first lens element further has a convex, positive, lens surface which adjoins the mating concave, negative, lens surface of the second lens element. In many systems, the improved performance due to the compensating effect in the change in focal length due to environmental variables of for lens systems with the properties noted above verses the degraded performance caused by the compounding effect of the alternate design above may be dramatic.

It should be noted that some of the properties listed above are specified as a consequence of overall lens design requirements. The property which is primarily responsible for the increased shift in focal length with changes in the selected environmental variable in the first case above is that the lens element formed by the glue has a positive focusing characteristic and would be classified as a positive lens element or as having a positive focal length. The property which is primarily responsible for the decreased shift in focal length and the compensating effect with changes in the selected environmental variable in the second case above is that the lens element formed by the glue has a negative focusing characteristic and would be classified as a negative lens element or as having a negative focal length. Generally stated, the shift in focal length of a lens due to relative changes in indexes of refraction of the various lens element materials with variation a selected environmental variable is reduced by configuring the lens design so that the lens element fabricated from the lens material which exhibits the greatest rate of change in index due to changes in the selected environmental variable has a negative focal length.

It is often beneficial to modestly diffuse the image to minimize aliasing and to improve the uniformity of response to smaller area light sources such as the images of headlamps or tail lamps in the field of view as these images are projected at various locations on the pixel array. In some cases the images of such objects may fall almost entirely on individual pixels and in other cases may fall on boundaries between pixels. The response of pixels in CMOS based imaging arrays to sub pixel sized features in the image is typically not very uniform and varies considerably as the position of the sub pixel sized spots of illumination change relative to the pixels of the array. Also, features of the image which have spatial frequency components which are too high cause Moire patterns and other effects in the images due to not meeting Nyquist criteria for a sampled data system. Often a combination of factors such as non-symmetry in pixel response characteristics of the imager to sub pixel size patterns of illumination and non-symmetrical requirements for image resolution make it more important to provide diffusion in one direction than another. This makes it appealing to provide an option to spread, fan, diffuse or smear the image by a controlled amount in a controlled pattern and orientation. The pattern may even be diffused in only one direction and perhaps left essentially unchanged in another. It also turns out that, with one optical surface, it is easier to provide uniform diffusion of a controlled width in one direction at a time than it is to provide it in to mutually orthogonal directions. An option used in some embodiments of this invention is to utilize more than one optical surface to accomplish the controlled diffusion or spreading utilizing a first surface to provide spreading primarily in one direction and a second surface to provide spreading in a second, preferably orthogonal, direction.

With a poorly corrected lens system, the projected image of a distant small area light source changes with both the color component being observed and with its position in the field of view making it really difficult to use defocus or even selection of a best focus to control diffusion of the projected image. It is preferable to design the lens system for better focusing capability and overall performance and to use an additional optical component or components or additional characterization of the lens surface to perform all or a portion of the controlled diffusion. A lens surface with repetitious corrugation like ridges designed to smear or diffuse the image preferably uniformly and preferably over a distance which is approximately equal to the pixel pitch or an integral multiple thereof in the direction of the spreading is effective to provide the controlled diffusion in the given direction. The ridged pattern of the diffusing surface may be applied to a separate lens surface or in some cases may be added to one or more active lens surfaces of the lens system. The ridged pattern is only an example and any one of a number of other patterns of lens surface modification may be used to achieve a diffusing effect and the diffusing effect does not need to be limited to a single direction. The technique has the advantage over techniques such as soft focus in that the amount of spreading is more controllable, more uniform over the image area, may be characterized in shape and orientation, is only weakly dependent on the aberrations in the image projected by the lens system, and is only weakly affected by focus making it possible to choose and consistently control the pattern and the amount of spreading. The description associated with FIG. 14 will demonstrate how diffusion may be added to increase the accuracy of intensity measurements. This may be done in a way which is minimally dependent on the spot size projected by the lens system when the diffusion is removed. This is accomplished by introducing an added diffusion which is uniform and extends over one pixel width preferably in both the vertical and horizontal directions within the image, (i.e.) in directions one of which is approximately parallel to the row direction and the other of which is approximately parallel to the column direction of the imaging device. Such diffusion may be obtained by cascading two diffusing filters each having an approximately linear diffusing effect, the filters being placed preferably so that the diffusing effect of one is approximately orthogonal to the diffusing effect of the other and further preferably so that the directions of one of the diffusing effects is approximately parallel to the row direction of the imaging device set this and the other diffusing effect is approximately parallel to the column direction of the imaging device. Patterns of spreading or diffusion which are characterized in directions which are related to and may preferably be generally aligned with the row and column directions of the pixel array are preferred. Amounts of spreading which are related to the dimensions or pitch of the pixels in the imaging array often result in increases in the accuracy of measurements which may be made based on pixel response values. This is a specific refinement and application of the general techniques presented generally in many of the commonly assigned patents and patent applications incorporated by reference elsewhere herein. In a preferred structure, lens systems which have good optical performance are used in combination with spreading, or diffusion of the projected image which is relatively well controlled in amount and direction and which remains nearly constant with modest changes in focus to substantially improve system performance.

Many of the commonly assigned patents and patent applications incorporated by reference elsewhere herein teach the use of red filters in combination with red complement or cyan filters or with no color filter to detect color and to use this detection capability particularly to distinguish red tail lamps from other light sources. Thus, the desired sharp transition between transmission and cut-off makes the multilayer interference based cyan filter preferable to dye or pigment based cyan filters. In practice, the available cyan filters which are based on the use of dye or pigment for their color filtering capability display relatively softer more gradual transitions as a function of color wavelength between relatively full transmission in the cyan color band and relatively full cut off in the red band. In practice, dye or pigment based red filters can have a sharper cut off characteristic than dye or pigment based cyan filters. Thus, filter combinations which incorporate multilayer cyan filters with dye or pigment based red filters may be configured to realize many of the benefits of this invention.

Particularly, when the filters are made of plastic, it has also proven to be impractical to include the infrared blocking function as a part of the color filter. By contrast, filters based on interference properties of multiple thin-film coatings may be designed to have customized sharp cut off characteristics for both the cyan and the red filters and the infrared blocking function may be included as part of the multilayer stack which also performs the color selective filtering functions. The drawbacks of the approach just outlined include relatively high cost per unit area of the filter when it is designed to the relatively tight specifications which are preferred for the application. Such a filter is also difficult to apply directly to the imager surface. In a preferred construction, the filter is conveniently incorporated as part of a very small area cover glass which is used to provide the protective cover window for the imager as part of the dam and fill package assembly. Optionally, the filter may be applied almost anywhere in the optical path, including application of the filter to a lens surface or to a preferably approximately flat, preferably glass surface in the lens structure. In some of these assemblies the area of the cover glass is only modestly larger than the active area of the imaging array and is substantially smaller than the total area of the silicon integrated circuit which includes the imaging array or arrays. This is significant since the cost of the filter per unit area may, for example, be more than half of the cost per unit area of the silicon integrated chip which contains the array. It is preferable to first test the imaging arrays while they are still in undiced wafer form. It is preferable to position and cement the combined filter and protective window covers over the imaging arrays on the wafer. The wafer is preferably diced after attachment of the windows. Regardless of whether the dicing is done before or after attachment of the filter window, it is preferable to avoid attaching windows to every imaging device but, rather to attach windows selectively to imaging devices which have passed the initial wafer level test. Elsewhere in this document, an explanation is given as to why larger defects may be tolerated on the outer surface of the cover glass than on the inner surface. Using similar arguments, it is evident that larger particles of dust and other manufacturing debris may be tolerated on the outer surface of the imager window than on the imager itself. Thus, there is considerable manufacturing benefit to placing the window on the die, particularly in the wafer stage, very early in the device fabrication process to avoid the necessity to maintain such stringent cleanliness standards through the fabrication process which is required when the non-windowed pixel array is directly exposed to the production environment. For example, the windows may be placed on the imaging arrays before sawing the wafer into its individual components or alternatively after sawing but while the die are still mounted to the tape or other carrier used to hold them during the wafer sawing process. In some embodiments, the cyan filter may be omitted and the combination of red filtering on one image with substantially no color filtering on the other image and with infrared rejection filtering extended over both filter areas may be used still realizing many of the advantages of structures described in this patent.

In a typical application, duplicate images of a light source in the scene are projected on separate areas of the imager, one after passing through a red filter and the other after passing through a cyan or red complement filter. The intensities of the red filtered and cyan filtered images are read from the corresponding locations on the pair of imaging areas on the array. The ratio of the intensity of the red filtered image to the intensity of the cyan filtered image is then taken to obtain a numerical indication of the color of the light source which was imaged. This color reading may be calculated and defined in a number of different ways but for convenience in this discussion will be assumed to have been measured and calculated as described above and will be referred to as the color ratio reading. For a given group of different light sources, the color ratio reading taken as indicated above varies over a much greater range than the color ratio readings for the same group of light sources taken using a prior art image sensor which measures and takes the ratio of a red filtered light level reading to an unfiltered light level reading rather than taking the ratio of a red filtered light level reading to the cyan filtered light level reading. The filters when characterized as described in the above also provided substantial advantage over dye based filters normally used for color filter arrays in cameras and other color imagers. Note that the improved results are obtained using the approximately complementary, multilayer, interference filter having sharp cut off characteristic as indicated in FIG. 10. Also there is preferably a modest gap between the 50% cut off points for the red and the cyan filters. It has also been discovered that use of filters which have sharp cut offs; that is, which make the transition from transmitting a large percentage of the light to blocking a large percentage of the light over a narrow color wavelength range increases the range over which the color ratio varies.

It is difficult to distinguish certain orange light sources from red tail lamps. One of the more difficult colors to distinguish from tail lamps is the reflection of light from halogen headlamps off of very bright orange signs. In experiments and simulations, it was discovered that provision of a modest gap between the cyan cut off point and the red cut off point increased the color ratio for reading the light from the tail lamps more than it did the color ratio for the light reflected from the orange signs making it easier to distinguish the two. In these discussions, it is most convenient to refer to the cut off point of a filter as the wavelength or color for which the filter transmission is approximately 50%. The nominal cutoff point for the red filter is preferably chosen at just over 600 nm. The main constraint here is that red LEDs used for tail lamps may have a very narrow emission spectra and selecting too long a wavelength for the cutoff on the red filter may block too much light from such tail lamps causing them to be missed or improperly sensed in the scene. The cutoff wavelength for the cyan filter may, for example, be 10 to 15 nm shorter than the cutoff selected for the red filter allowing a 10 to 15 nm gap between the nominal cutoff points. These numbers are examples and wider or narrower gaps may be used. Overlap, although not preferred, may provide satisfactory performance which may still be an improvement over prior art. In the above, the red cutoff refers to the nominal wavelength which might, for example, be 605 nm for which the filter transmission is nominally 50% and for which the transmission falls toward the blocking value for decreasing wavelengths and increases toward full transmission for longer wavelengths maintaining a high transmission level until it decreases to cutoff and finally to blocking as the wavelength increases to and beyond the infrared cutoff wavelength. The infrared cutoff may, for example, be set at 700 nm. The blocking is preferably maintained far enough into the IR region so that the combined effects of partial blocking of IR by the windshield and reduced sensitivity of the imager at longer wavelengths will result in a desirably low response to infrared, IR, for the combined camera system. For example, a wavelength in the range of 900 to 1500 nm may be a reasonable long wavelength for which good infrared blocking is maintained at shorter wavelengths. Although the cyan filter is already blocking in the red and there is not an additional transition to blocking in the infrared range, there is a tendency for multi layer filters to block transmission through a range of wavelengths and for significant transmission to return for wavelengths which are either above or below this range. Thus, depending on the filter design for the cyan filter, added layers may be needed to extend the blocking into and through the required portion of the infrared range. For the cyan filter, higher transmission is maintained from about 400 nm until transmission falls to 50 percent at the cutoff frequency, which may, for example, be 590 nm, and continues to fall toward blocking with further increases in wavelength and preferably maintains the low transmission blocking state through the red part of the spectrum and also through a portion of the infrared spectrum. In many embodiments, it is desirable to selectively and individually deposit the portions of the filter layer stack which characterize the cyan and the red filters in the visible part of the spectrum using masking of some type to select areas for the individualized coatings and through either preceding or succeeding steps to apply a set of layers which are common to both the red and cyan filter portions characterizing this common portion of the filter to create, enhance, or extend the infrared cutoff and blocking in the infrared region of the spectrum. The common portion of the stack of filter layers is preferably designed to operate properly in conjunction with each of the separately applied stacks of the red and cyan sections and the red and likewise the cyan portions of the filter stack are preferably designed to work properly in conjunction with the common layer. The entire layer should also be designed to function properly with its interface to the optical properties of the substrate and to the medium on the side opposite the substrate (clear glue in a preferred embodiment). Many commercially available multilayer filters are designed to interface with air on the side opposite the substrate.

It is preferable to space the single or possibly multiple filter surfaces some distance from the imaging surface. After passing through the lens system, a packet of rays which is focused to a point or small area on the imager surface assume a generally conical shape the diameter of the cone becoming smaller as the distance from the imaging surface decreases. Imperfections in the filter coating will generally cause problems when the size of the imperfections is not small relative to the diameter of the cone of rays at the distance where it intersects the filter surface. Thus, substantially larger imperfections may be tolerated at the outer surface of the cover glass than at the inner surface which may be positioned very close to and perhaps in contact with the surface of the imager.

The inclusion of infrared blocking function as part of the infrared and cyan filters is preferred; but, optionally, the infrared may be applied as a separate filter which preferably filters both the cyan and the red filtered images. This filter might be placed on the same surface on top of or below the red and cyan filters, in which case it may be equivalent to what is described above, or on the opposite side of the imaging window. In alternate constructions, the filters may be placed on the imager side of the window or almost anywhere in the optical path of the lens systems which focus the light. With multilayer filters, the wavelengths at which filtering effects occur change as a function of the angular deviation of the light rays from the normal to the filter surface as they pass through the filter and the effect is also modestly polarization sensitive. These effects may be taken into account in the design; but, as long as the light travels through the filter in a direction that is approximately perpendicular to the surface, these effects are minimal. With the preferred designs, most of the rays which are focused onto the central region of the image travel through the filter in directions which are fairly close to the normal to the filter. Furthermore, due to the similarity in optical paths for rays passing through the two filters, the patterns of deviation of the rays from the normal direction tends to be matched from one filter and associated lens system to the other as they are focused from corresponding portions of the scene through the two separate lens systems. As a result, shifts in filter wavelength characteristics due to variations in the angle of incidence of light rays to the filters tend to track from one filter to the other. These patterns of deviation from the normal direction are also similar for rays of different colors focused from a particular portion of the scene onto a given one of the two filters. As a result of the features of the design described above, filter characteristics due to patterns of deviation in the angle of incidence of the light striking the filter for both of the given filters tends to shift uniformly over the full color spectrum. Thus, any shift that occurs at one color either on the same or the other filter will tend to also occur for other colors. This tends to keep more nearly constant widths for passbands for each of the filters. Also, the preferred small gap in wavelengths between the red and cyan filters tends to be preserved with changes in the angle of the source of the light in the scene even though the cutoff points may change. In other words each cut off point tend to shift by approximately the same amount preserving a preferred gap or possible overlap in the transmission bands of the two filters. Another advantage is that filter characteristics shift toward the blue as the angle that the light travels through the filter deviates more from normal incidence. Thus the red cutoff will shift to a slightly shorter wavelength for off normal angles. This shift is in a direction to continue to include rather than to undesirably block light from tail lamps which may have wavelengths near to the short wavelength cutoff of the red filter. From the discussion above, it may be inferred that the changes in filtering characteristics of the multiple layer color filters with changes in angular position of a light source within the scene track each other in a way that tends to minimize changes in the measured ratio of readings of the intensity of a common light source taken through the two separate color filters.

One of the advantages of the preferred structures of this invention is that each lens structure has only one optical surface which interfaces with the air. Minimizing the number of surfaces which interface with air reduces surface reflection and the potential to collect contamination or moisture which may compromise the optical quality. The structure with this one optical surface which interfaces to the air includes internal, non-air spaced optical surfaces which include provision for color correction, general reduction in lens system aberrations, directionally selective diffusion, and color filtering with infrared rejection. The lens structure of a preferred device also includes both entrance lens elements on a common piece or substrate and both color correcting lens elements on a common piece. Directionally selective filters which selectively diffuse the image in the horizontal and/or vertical direction are also provided on a common piece.

Many vehicle equipment control systems have been proposed that incorporate imaging systems and related processors. In at least one embodiment described herein a single imaging system is provided to facilitate multiple vehicle system functionality. In at least one embodiment multiple imaging systems are provided to individually serve multiple or singular applications.

Vehicle exterior light control systems using a camera and image processing system have been developed and disclose in commonly assigned U.S. Pat. Nos. 5,837,994, 5,990,469, 6,008,486, 6,130,448, 6,130,421, 6,049,171, 6,465,963, 6,403,942, 6,587,573, 6,611,610, 6,621,616, 6,631,316 and U.S. patent application Ser. Nos. 10/208,142, 09/799,310, 60/404,879, 60/394,583, 10/235,476, 10/783,431, 10/777, 468, 09/800,460 and 60/590,736; the disclosures of which are incorporated herein in their entireties by reference. In these systems, images are acquired of the view forward a motor vehicle. In at least one embodiment, an image sensor is optically coupled to the interior surface of the windshield such that reflections and, or, refraction from the interior windshield surface is substantially eliminated. These images are processed to determine the presence or absence of oncoming or preceding vehicles and the controlled vehicles exterior lights are adjusted, for example by turning off the high beams, to prevent glare to the drivers of other vehicles.

Moisture sensing, windshield wiper and HVAC controls are described in commonly assigned U.S. Pat. Nos. 5,923,027 and 6,617,566 as well as U.S. patent application Ser. Nos. 09/970,728 and 60/472,017, the entire disclosures of which are incorporated herein by reference.

With reference to FIG. 1, a controlled vehicle 105 may comprise a variety of exterior lights, such as, headlight assemblies 120a, 120b, foul conditions lights 130a, 130b, front turn signal indicators 135a, 135b, taillight assembly 125a, 125b, rear turn signal indicators 126a, 126b, rear emergency flashers 127a, 127b, backup lights 140a, 140b and center high mounted stop light (CHMSL) 145.

As described in detail herein, the controlled vehicle may comprise at least one control system incorporating various components that provide shared function with other vehicle equipment. An example of one control system described herein integrates various components associated with automatic control of the reflectivity of at least one rearview mirror element and automatic control of at least one exterior light. Such systems 115 may comprise at least one image sensor within a rearview mirror, an A-pillar 150*a*, 150*b*, a B-pillar 155*a*, 155*b*, a C-pillar 160*a*, 160*b*, a CHMSL or elsewhere within or upon the controlled vehicle. Images acquired, or portions thereof, maybe used for automatic vehicle equipment control. The images, or portions thereof, may alternatively, or additionally, be displayed on one or more displays. At least one display may be covertly positioned behind a transflective, or at least partially transmissive, electro-optic element. A common controller may be configured to generate at least one mirror element drive signal and at least one other equipment control signal.

Figure 2:
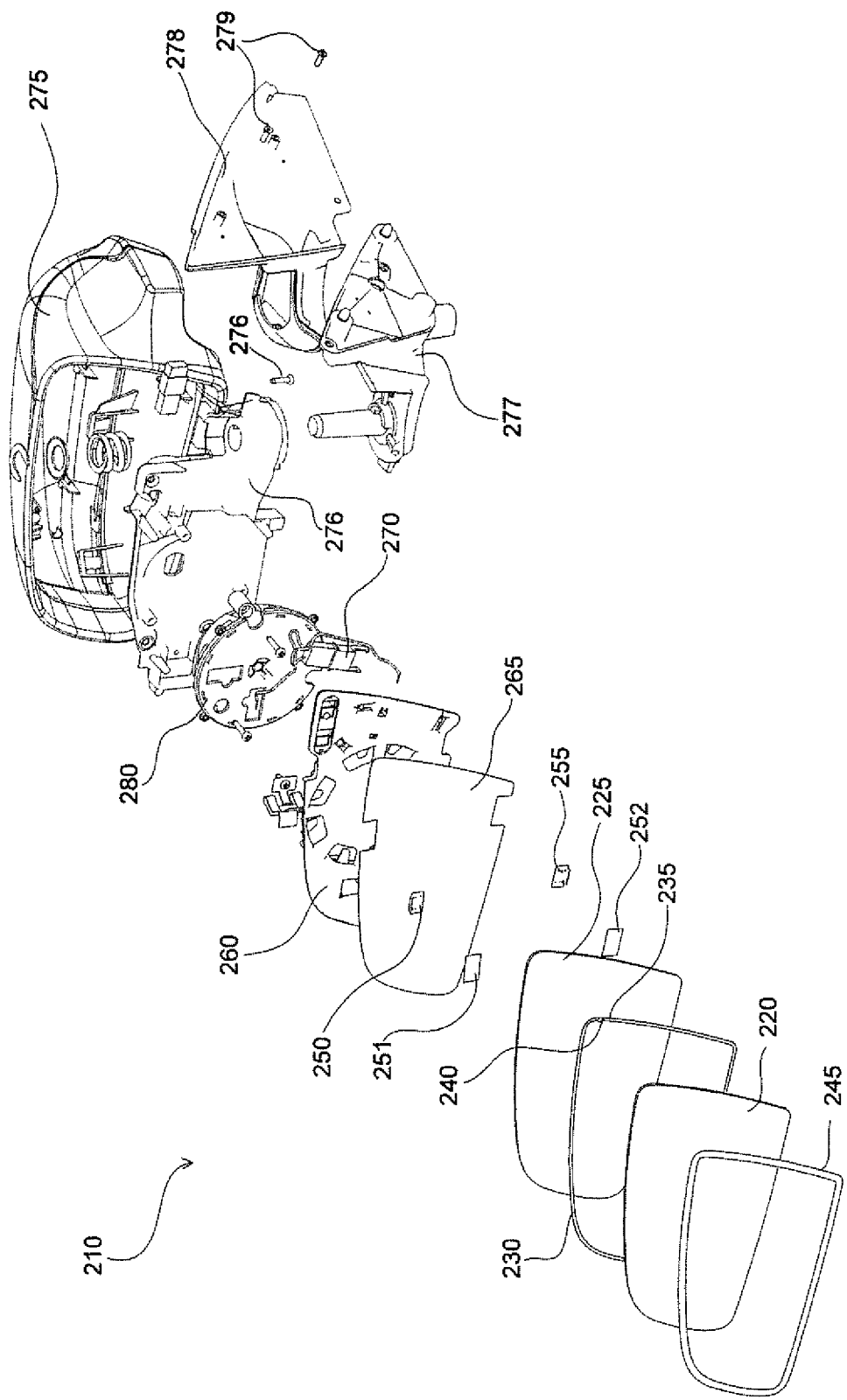
FIG. 2 depicts an exploded view of an exterior rearview mirror assembly having an improved optical structure.

Turning now to FIG. 2, various components of an outside rearview mirror assembly 210 are depicted. In at least one embodiment, an electro-optic mirror element is provided comprise a first substrate 220 having at least one conductive/reflective coating on an inward facing surface secured in a spaced apart relationship with a second substrate 225 having at least one conductive/reflective coating on an inward facing surface via a primary seal 230 to form a chamber there between. In at least one embodiment at least a portion of the primary seal is left void to form at least one chamber fill port 235. An electro-optic medium is enclosed in the chamber and the fill port(s) are sealingly closed via a plug material 240. Preferably, the plug material is a UV curable epoxy or acrylic material. Also shown is a spectral filter material 245 located near the periphery of the element. Electrical clips 250, 255 are preferably secured to the element, respectively, via first adhesive material 251, 252. The element is secured to a carrier plate 260 via second adhesive material 265. Electrical connections from the outside rearview mirror to other components of the controlled vehicle are preferably made via a connecter 270. The carrier is attached to an associated housing mount 276 via a positioner 280. Preferably, the housing mount is engaged with a housing 275 and secured via at least one fastener 276. Preferably the housing mount comprises a swivel portion configured to engage a swivel mount 277. The swivel mount is preferably configured to engage a vehicle mount 278 via at least one fastener 279. Additional details of these components, additional components, their interconnections and operation is provided herein.

Figure 3:
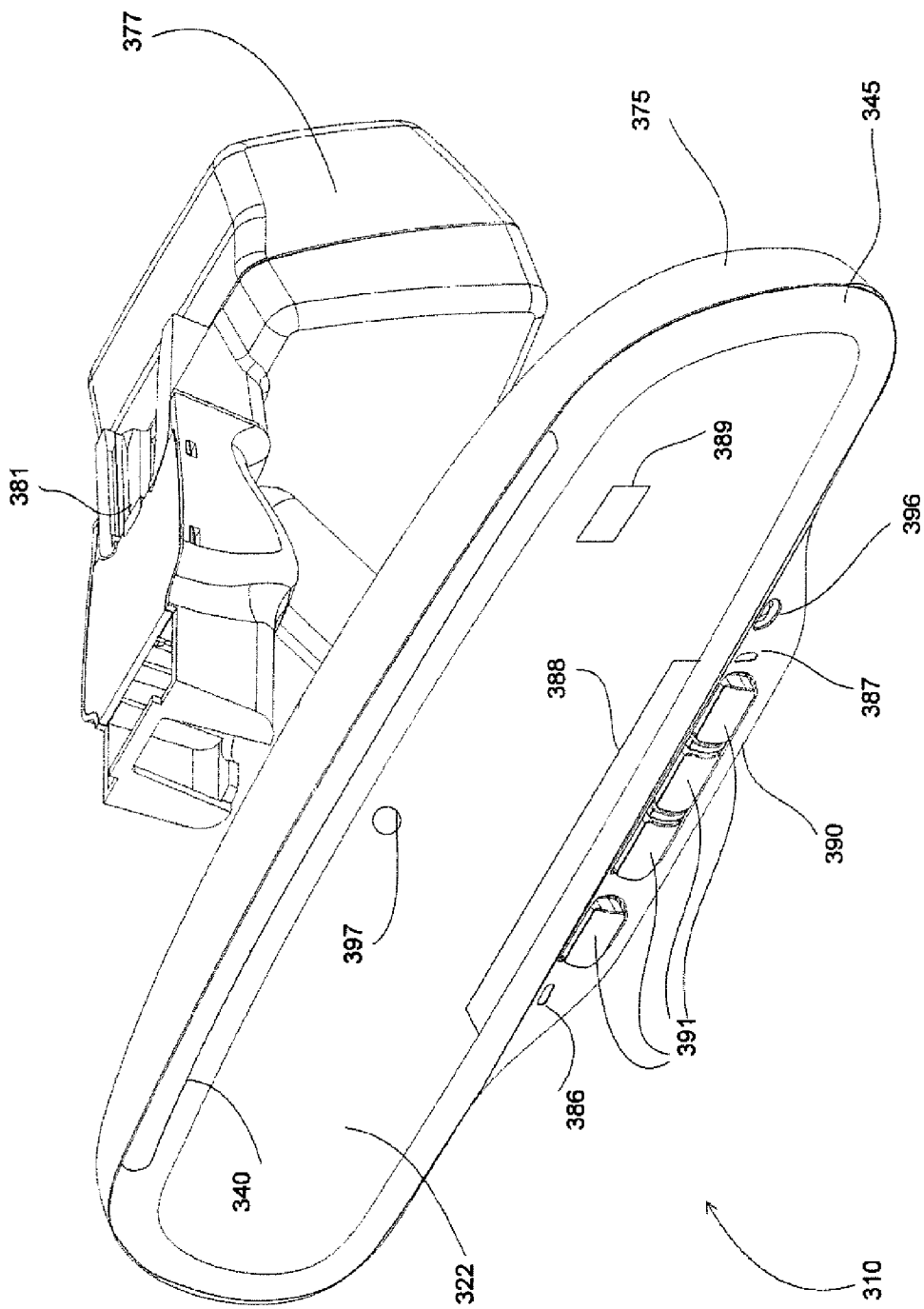
FIG. 3 depicts an interior rearview mirror assembly having an improved optical structure.

Turning now to FIG. 3, there is shown an inside rearview mirror assembly 310 as viewed looking at the first substrate 322 with a spectral filter material 345 positioned between the viewer and a primary seal material (not shown). The mirror element is shown to be positioned within a movable housing 375 and combined with a stationary housing 377 on a mounting structure 381. A first indicator 386, a second indicator 387, operator interfaces 391 and a first photo sensor 396 are positioned in a chin portion 390 of the movable housing. A first information display 388, a second information display 389 and a second photo sensor 397 are incorporated within the assembly such that they are behind the element with respect to the viewer. As described with regard to the outside rearview mirror assembly, it is preferable to have devices 388, 389, 397 at least partially covert.

In preferred embodiments of such systems, lights from other vehicles and non-vehicular objects are identified by locating peak points of brightness in the image. Once located various properties of these bright points, such as the brightness, color, position, width, height, and motion are determined. The values of these parameters are analyzed using statistical methods to determine if the bright points correspond to the headlamps or tail lamps of other vehicles, or to non-vehicular light sources such as signs, reflectors, or other stationary lights. A significant challenge in the development of the image processing algorithms for vehicular lighting control is properly classifying the peak points in the image. Failure to correctly identify a light source may result in glare to the other vehicles, or shutting off of the high beams at inappropriate times resulting in controlled vehicle driver dissatisfaction.

Figure 4:
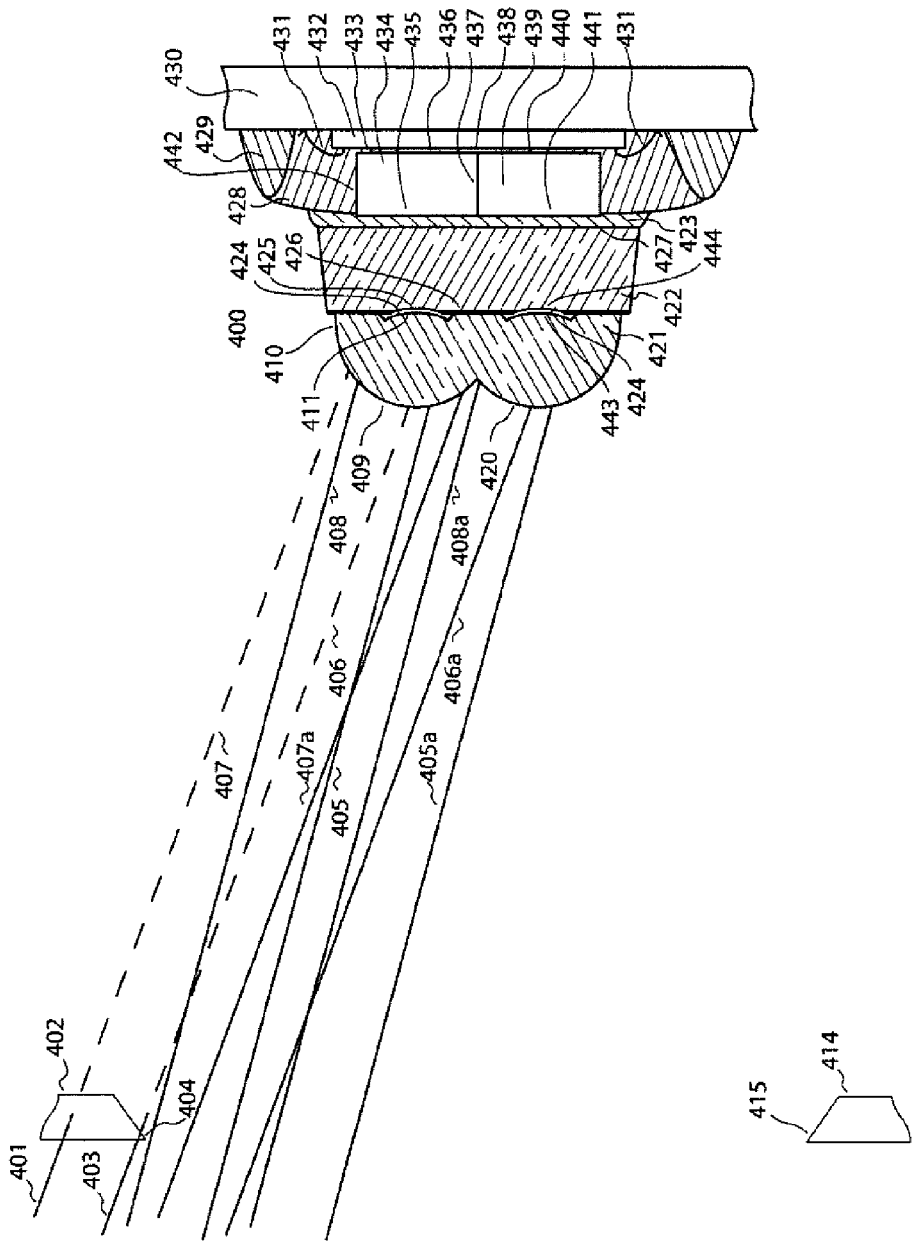
FIG. 4 depicts an image sensor having an improved optical structure.

FIG. 4 depicts a preferred embodiment which includes a combination of features which are part of this invention. In the simplified drawing of FIG. 4, some of the sections particularly of lens members 421 and 422 depict only surfaces cut by the section since inclusion of lines visible back of this section would be confusing in the drawings. The embodiment of FIG. 4 is based on the projection of two separate images each through its own color filter onto its own separate area of the imaging sensor to enable red/non-red color sensing to be used as part of the control function for which it is designed. A baffle system shown in fragmentary view as members 402 and 414 is used to shield the optical system from stray light and to prevent troublesome overlap of the projected images. This baffle system and the dual imaging system are generally described in many of the commonly assigned patents and patent applications incorporated by reference elsewhere herein. In a novel configuration the two compound lenses used in the optical structure each contain at least two elements which are utilized to partially correct chromatic aberration, to increase the usable field of view, and to substantially improve overall lens system performance.

The compound lenses in the lens structure are positioned and cemented by glue layer 423 to the combined filter and imager window 442. The window 442 covers imaging area 436 which images the top image and imaging area 440 which images the lower image. The imaging areas are part of the solid-state imaging array 432. The array is preferably mounted to a circuit board or other substrate shown in fragmentary view as member 430. Lead bond connections 431 electrically connect the imaging array 432 to other portions of the circuit. The chip 432 which contains the imaging array may also perform a number of the control and signal processing steps required by the imaging function. The substrate and circuit connection members of which 430 is representative are shown in a very simplified view and include required peripheral components and provide connections to receive power and imager control commands and to communicate signals from the imaging system to other members of the overall control system.

In a preferred design the cover glass 442 is preferably cemented with transparent glue to the imaging array of 432 so that it covers the pixel sensing area. A ridge 429 of viscous, thixotropic material is dispensed around the periphery of the imaging device preferably being placed outside of the lead bond area and a more fluid material 428 is dispensed in the moat which remains between the cover glass 442 and the dam 429 or other retaining member. The glue in this assembly is cured, perhaps in multiple steps.

In the exemplary design, the field of view for the sensor extends approximately from minus 15° to plus 15° in the elevational direction and from minus 25° to plus 25° in the horizontal direction. Rays 405 and 408 depict the lower and upper boundaries of a packet of rays from a distant source with an elevational angle of approximately 15° which enter lens surface 409 are focused through the lens surfaces 411 and 425 through transparent glue layer 423 through red filter surface 435 through side 434 of cover glass assembly 442 and finally focus on imaging surface 436 of imaging device 432. A similar packet of rays bounded on the lower side by ray 405a and on the top side by ray 408a enter lens surface 420, travel through a path which generally parallels the optical path of the upper compound lens assembly, pass-through cyan filter surface 441 through portion 439 of cover glass assembly 442 and finally focus on imaging surface 440 of imaging device 432.

The baffle arrangement is generally described in many of the commonly assigned patents and patent applications incorporated by reference elsewhere herein. Rays 401 and 403 are blocked by baffle portion 402. Otherwise they would continue on as rays 406 and 407 and focus on a point below the lower part of the upper image area 436 possibly falling on the upper portion of lower imaging area 440. A narrow area 438 is provided between active imaging areas 436 and 440 in order to provide a tolerance zone for rays which enter through lens surface 409 and are focused just a little below the active area of imager zone 436 which is provided to register the image focused by the top lens assembly. Analogously, rays which enter lens surface 420 and are focused just a little above the active area of imager zone 440 will also fall on the area 438 between the active areas 436 and 440.

The exemplary compound lens system was modeled using the ZEMAX®-EE Optical Design Program, which was released on Nov. 12, 2005 from Zeemax Development Corporation. It is presumed that someone undertaking a similar lens system design will proceed from an appropriate starting point and supply specific lens material refractive properties. Thus, only partial details will be given to provide a reasonable starting point for such a design. The glue used in the modeling is an epoxy or an acrylic based glue with a nominal refractive index of about 1.51 and dispersive properties similar to those of acrylic. This glue is used in the glued doublet lens interfaces between acrylic member 421 and polycarbonate member 422 and also at interface 423 between polycarbonate member 422 and filter and cover glass member 442. The filter is modeled as Schott Borofloat33© which has a nominal refractive index of 1.47.

The compound lens systems with entrance surfaces 409 and 420 are ideally optimized for the specific ranges of wavelengths which are transmitted by their associated color filters but with the relatively good correction inherent in the design should be very close to one another and may reasonably and optionally be designed to the same prescription. Lens system parameters are in millimeters and specified in the form used by the ZEEMAX® program. Lens element thicknesses are specified along the center axis of the lens system. Surface 409 is a sphere and has a nominal radius of 1.77 mm and the acrylic lens element thickness from 409 to 411 is nominally 2.1 mm. In the preferred designs, aspheric coefficients and conic constants which are not specified are assumed to be zero. Here, the thickness of the lens element with the higher Abbé number is greater than the radius of the front lens surface. This turned out to be a good balance in the lens design and is one of the factors which enables the lens surface at the interface between the material of higher and lower Abbé numbers to provide color correction while enlarging the field of view over which relatively low lens system aberrations are maintained. Acrylic back lens surface 411 is an even asphere with a radius of −2.3 mm, a coefficient of $r^4$ of −0.15 and a coefficient of $r^6$ of −0.15. The glue layer between acrylic back lens surface 411 and polycarbonate front lens surface 425 is 0.1 mm thick. Polycarbonate block 422 has front lens surface 425 which is an even asphere with a radius of −2.4 mm, a coefficient of $r^4$ of −0.16 and a coefficient of $r^6$ of −0.16. In the exemplary design, the aperture stop 426 is placed on the front side of the polycarbonate lens block 422 and has a nominal radius of 0.55 mm. The nominal thickness of the polycarbonate lens block 422 measured from the center of lens surface 425 is 1.825 mm. The nominal glue layer thickness 423 is 0.25 mm and the nominal thickness of the filter and cover glass 442 is 1.4 mm. The surface of the imager is very close to the cover glass and is preferably also glued to the cover glass. With the design just described the front lens surface 409 for the one lens system and 420 for the other lens system are the only material to air interfaces in the optical paths of the lens systems. That is, each lens system has only one surface with an air interface in the path from the first surface of the lens system through to the imager. This construction for which each compound lens system has multiple active optical surfaces with only one surface which interfaces with air helps to minimize surface contamination and reduces surface reflections without the need for antireflection coatings at the non-air interface surfaces.

The cover glass assembly 442 preferably contains two filter sections 435 and 441. These filters may either be deposited using a patterning process on a single piece of glass for 442 or glass assembly 442 may be made of two separate blocks of glass placed next to each other such that 434 and 439 are separate blocks of glass. The separate blocks of glass may then be cut from a larger sheet with a single filter coated on the surface eliminating the need to pattern of the filters. Filter surface 435 is preferably placed on the face of cover glass section 434. This filter may, for example, be a red filter with an infrared blocking capability as detailed in FIG. 13. Filter surface 441 is preferably placed on the face of cover glass section 439. This filter may, for example, be a cyan filter with an infrared blocking capability as detailed in FIG. 13. An aperture stop surface 426 is preferably placed on the front surface of polycarbonate lens element block 422. The front surface of polycarbonate block 422 is preferably approximately flat except for the two lens surfaces 425 and 444. This flat surface makes it convenient to use a screen printing process to apply aperture stop 426. Acrylic lens element pair 421 contains lens surfaces 409 and 420 on the front and corresponding lens surfaces 411 and 443 on the back. Good alignment of the optical axes of lens surfaces 409 and 420 with the corresponding lens surfaces 425 and 444 is important for good optical performance. This alignment may be accomplished either through careful positioning of the parts one to another or through the use of an active alignment procedure. In lens member 421, the surfaces of the lens have preferably been extended beyond the active area through which light is focused onto the imager. The extended lens surfaces are blended into an approximately cylindrical surface at the back which is designed with a draft angle for molding purposes. This design, besides being easy to fabricate a mold to make the part, maintains a shape over the majority of the front lens surface that is resistant to the effect of bending stresses and resulting distortions as the plastic solidifies from the outside walls into the center of the part during the molding process. The larger flat portions on the back of lens member 421 will preferentially be subjected to bending stresses and do more flexing to accommodate shrinkage as the plastic cools and solidifies in the mold. With the lens design, this displacement at the back is less damaging to lens performance than comparable displacements on the relatively critical front lens surfaces 409 and 420. The thin material in a conventional balloon or similar inflatable object has almost no rigidity to bending stresses. The shapes that a balloon or other flexible walled vessel may assume when inflated may be used to give intuition as to what overall lens surface outline shapes are generally resistant to the distorting effects of bending stresses created as plastic shrinks in the interior of the part as it solidifies in the molding process. The requirement might be stated as follows: tolerance critical surfaces such as active lens surfaces 409 and 420 preferably with an extended area around the active areas are preferably configured to approximately conform to a surface shape which can support internal pressure or vacuum without incurring appreciable bending stresses. Portions of the molded lens surface which meet this requirement are relatively resistant to detrimental deformation due to stresses which result from solidification of the part near to its surface as it cools during the molding process. The stress referred to above may result largely from the pressure or vacuum created by the molten fluid portion which remains for a period of time within the center of the part as it cools. The result is that other portions of the surface, particularly flat or convoluted portions, tend to yield to and be displaced to partially relieve these pressure differences. Often the deformations caused by this process are irregular and certainly not the sort of deformations which may be satisfactorily accommodated in precision lens surfaces. They are so prevalent and unsightly on some molded parts particularly in flat areas that they have gained the popular designation as sink marks. Since flat, appropriately convoluted, or other surface shapes are more readily deformed by pressure differences, it is prudent to include such surfaces in less tolerance critical portions of the overall molded lens structure in order to intentionally relieve pressure differences which build up in the part as it cools thereby minimizing deformation of tolerance critical portions of the lens surface. The intersecting lens surfaces 409 and 420 of lens structure 521 meet the requirement for a surface which may support appreciable pressure differences without incurring appreciable bending stresses. These optical surfaces preferably extend beyond the optically active portion.

Lens surfaces 411 and 443 have been made somewhat larger than lens surfaces 425 and 444 which are bounded by aperture stop surface 426. The intent is to allow for parallax and slight misalignment of the lens surface 411 with the aperture stop and lens surface 425 and of lens surface 443 with the aperture stop and lens surface 444. There are a number of other constructions which fall in the scope of this invention. For example, the aperture stop surface might be placed on the back of lens block 421 instead of on the face of lens block 422 and then, the diameter of lens surfaces 425 and 444 might be increased to accommodate tolerances and the diameters of lens surfaces 411 and 443 might be reduced to the aperture stop diameter. For any of these adjustments, re-analysis of the lens design may be performed and adjustments, which for the type of changes described these will normally be minimal, may be made in order to optimize the lens design to work with the changes. Furthermore, in some designs it is advantageous to place the aperture stop in an entirely different location. For example, the aperture stop may be placed at the lens surfaces 409 and 420. The diameter of lens surfaces 411 and 425 and of lens surfaces 443 and 444 must be increased significantly to accommodate this change. Also, for an equivalent F number, the diameter of the aperture stop itself will increase considerably. Also the lens system will become even less tolerant to axial misalignment of lens surfaces, especially of surface 409 with surface 425 and surface 420 with surface 444. With the aperture stop moved to the front lens surface, performance for rays which are more than about 15° off of the center axes was not as good. Overall though, with the exceptions noted, the general lens prescription and the general configuration and performance of the lens system is similar to the one depicted in FIG. 4.

The structure of FIG. 4 is an exemplary design and other designs still within the scope of this invention may differ in many details. For example, aspheres or other nonspherical surfaces may be used in place of spherical surfaces, and non-spherical surfaces may be prescribed in any one of a number of different forms, polynomial terms and conic constants being two of the more common. These specifications may in some cases be nearly equivalent but do not necessarily need to be to fall within the scope of this invention. This comment applies also to detailed lens surface specifications given for other embodiments in this specification including the exemplary designs of FIGS. 16 and 25.

FIG. 5 is a front view 521 of lens member 421 which is shown in sectioned side view in FIG. 4. The two extended lens surfaces showing as 409 and 420 in FIG. 4 show as 509 and 520 in FIG. 5. The line of intersection 560 indicates how the two approximately spherical lens surfaces intersect with one another, the surfaces approximately adjoining one another over an appreciable distance.

FIG. 6 is a back view 621 of lens member 421 of FIG. 4. Lens surfaces shown in profile view as 411 and 443 in FIG. 4 show in outline view as lens surfaces 611 and 643 in FIG. 6. The larger circle 660 indicates the boundary of a transition zone used to modestly recess the edge of lens surface 611 from the back surface of lens member 421 to provide a small clearance for glue between the lens surfaces most clearly depicted in edge view as lens 411 and 425 in FIG. 4.

A method of providing controlled diffusion of the image will be described in more detail in connection with FIG. 7 and FIG. 11. FIG. 6a indicates a modification to the design of FIG. 4 to provide a relatively flat surface on the back side of lens block 421 into which a lens pattern may be molded to provide part or all of the controlled diffusion to be added as will be described in more detail in FIGS. 7 and 11. In a the design of FIG. 4, the glue used to fill space 424 between lens surfaces 411 and 425 in FIG. 4 has optical properties which are very close to those of acrylic lens member 421 and correspondingly dissimilar to the optical properties of polycarbonate lens block 422 so the lens surface 411 is largely blended out becoming very weak and the more powerful lens effect is between the glue 424 joining the surfaces and polycarbonate lens surface 425. Provision of the similarly shaped lens surfaces 411 and 425 with the relatively uniform space between them as shown in the design of FIG. 4 makes the design more tolerant to variation in properties of the glue. However, with more detailed attention to the optical properties of the glue and a modest redesign of the lens system, the design may be reconfigured to provide approximately flat surfaces in place of lens surfaces 411 and 443. The glue of 424 is preferably chosen with a relatively high Abbé number, preferably similar to that of the acrylic. However, in the modified design, the glue is preferably selected also so that its index of refraction differs at least modestly from that of the acrylic material of lens member 421. With this modification, the interface of the flat lens surface 411 with the glue is a convenient place to introduce a lens pattern, for example one such as described in FIG. 7, to provide all or a portion of a pattern of controlled diffusion to enhance the overall optical properties of the lens and imaging system. In the designs described in detail here, this diffusion is intended to minimize aliasing and to improve the accuracy with which the intensity of small light sources may be read.

The feature of the lens construction to provide controlled diffusion may be extended to diffuse an image over multiple pixel sized areas. For applications where a single rather than a dual lens system is used to project a single image on an imager, an array of individualized color filters is typically aligned with individual pixels creating patterns of pixels with differently colored filters within the imaging array. The multiple pixel areas over which diffusion is needed then normally correspond to groups of pixels having different individualized color filters in a color filter array. The Bayer pattern color filter array commonly used in cameras is one type of array which might be used. For the Bayer pattern, it is normally desirable to extend diffusion over a two by two pixel area. For some applications, it may be preferable to use striped patterns, either of alternating red and red complement or of the more conventional red, blue, and green filters with their associated rows or columns of pixels. For alternating stripes of two colors, the controlled diffusion would, for example, be extended over a two pixel width in a direction perpendicular to the stripes. For three stripes, the controlled diffusion would be extended over a three pixel width in a direction perpendicular to the stripes. In both of these cases, if diffusion is also provided in a direction parallel to the stripes, it is preferable to diffuse over one pixel width in the direction parallel to the stripes. In order to minimize cross talk it is also preferable to generally align the filter stripes with areas of reduced sensitivity on the filter array. For example, the region along the column lines has reduced sensitivity in many CMOS imager constructions so it is preferable to orient the filter stripes so that they generally parallel the pixel columns for these imager constructions.

In FIG. 6a, it is assumed that the modifications of the lens structure of FIG. 4 as described in the preceding section have been made and the back view of lens member 421 of FIG. 4 which is shown as 621 in FIG. 6 is replaced by 621a of FIG. 6a. Taking into account the indexes of refraction of lens block 421 and of the glue layer 424 and, also, the optical path from the back surface of lens member 421 to the imager surface, the diffusing pattern described in FIG. 7 is characterized to provide a one pixel wide diffusion of the image in the horizontal direction at the imager surface. This pattern is incorporated into the mold and molded onto lens surface areas 611a and 643a through which light focused by the lens system passes and serves to provide the one pixel wide diffusion in the horizontal direction for each of the two lens systems with their associated filters and imaging areas. The lens member 421 which is modified as indicated in FIG. 6a is positioned and glued to lens member 422 in much the same way as is described for the original lens structure.

FIG. 7 is a front view 722 of lens member 422 of FIG. 4. Aperture stop surface 726 applied to the front surface of lens member 422 showing in edge view as line 426 in FIG. 4 is depicted with stop apertures 725 and 744. FIG. 8 depicts the back surface 827 which is shown as back surface 427 of lens member 422 of FIG. 4. Taking into account the indexes of refraction of lens block 422 and of the glue layer 423 and, also, the optical path from the back surface of lens member 422 to the imager surface, the diffusing pattern described in FIG. 7 is characterized to provide a one pixel wide diffusion of the image in the vertical direction at the imager surface. This pattern is incorporated into the mold and molded onto area 800 of back surface 827 in order to provide the one pixel wide diffusion in the vertical direction for each of the two lens systems with their associated filters and imaging areas. Thus, the combined, effects of the diffusing surface of FIG. 6a which is effective to provide the one pixel wide diffusion in the horizontal direction and the cascaded effect of the diffusing surface of FIG. 8 which is effective to provide the cascaded one pixel wide diffusion in the vertical direction provides a square pattern of uniform diffusion which is approximately 1 pixel wide in both the row and column directions of the associated sensing array.

The substantially higher Abbé number of the acrylic relative to the polycarbonate is the most important distinguishing property of the two lens materials and other plastic or glass materials may be used. For example cyclic olefin copolymer plastic may be used in place of the acrylic. A styrene type of material may be substituted for the polycarbonate where temperature ranges in the application permit. In these cases and even for significant lot to lot variation in material optical properties, lens modeling and appropriate adjustment of the lens prescription may be needed.

FIG. 9 is a front view 942 of filter array 442 of FIG. 4. Area 935 preferably has the combined red and infrared reject filter and area 941 preferably has the combined cyan and infrared reject filter. As previously explained, these filters may be patterned onto a common transparent substrate or optionally may be placed on two separate pieces of glass which are then placed next to each other to form a completed window assembly 942.

FIG. 10 indicates a lens surface 1000 shown as an edge profile. This surface is approximately cylindrical and the material to the left has an index of refraction which is modestly higher than the index of refraction of the material to the right. This is for the purpose of illustration and the design may be readily adjusted to function properly when the material to the right has a higher index. Three representative rays 1001, 1002, and 1003 are shown. Were it not for the optical surface 1000 and the differing indexes of refraction of the material on either side of this surface, the three rays would continue respectively as 1010, 1008, and 1007 converging to point 1013 on the imaging array 1018. The imaging array 1018, shown in a simplified form, has pixels 1015, 1016, and 1017 all shown in a side view. The surface 1000 is preferably composed of small segments of parabolic curves which may be closely approximated by best fit circular segments. Since the circular sectors are easier to work with and each may be specified by its radius and by the number of degrees subtended by the sector about the center of the circle of which it is a part, the following description will be given in terms of the approximating circular arcs. The number of degrees subtended by the sector about the center of the circle of which it is a part will be referred to simply as the angle of this sector in the ensuing discussion. Circular sectors of approximately equal radii and of approximately equal angles, attached so that each is tangent to the next and so the curvatures alternate with one being concave to the right, the next being concave to left, the next concave to the right and so on. Ray 1001 intersects surface 1000 at point 1004 which is one of the periodically occurring locations where the tangent to the curve 1000 slopes upward and to the right as steeply as any other tangent to the curve. So, instead of continuing on path 1010, ray 1001 is refracted slightly upward as ray 1009 which strikes imager 1018 at point 1012. Similarly, ray 1002 intersects surface 1000 at point 1005 which is one of the periodically occurring locations where the tangent to the curve 1000 slopes upward and to the left as steeply as any other tangent to the curve. So, instead of continuing on path 1008, ray 1002 is refracted slightly downward as ray 1011 which strikes imager 1018 at point 1014. Ray 1003 passes through lens surface 1000 approximately in the normal direction and continues on with essentially a 0° refractive angle as ray 1007 striking the imager at 1013. The configuration is such that points 1012 and 1014 are approximately at the extremes of the pattern of deviation of the cone of rays diffused by lens 1000 from their original point of focus at point 1013. The profile of surface 1000 as it has been described is such that other rays will tend to fill in the space between 1012 and 1014 in a relatively uniform manner. The angle for each of the arcs 1020, 1021, 1022, and 1023, is preferably indicated as the number of degrees each arc segment subtends about its center rather than by its lineal dimension. With proper adjustment of the angle of these arcs relative to the indexes of refraction on either side of lens surface 1000 and the distance from lens surface 1000 to imaging surface 1018, the width of the pattern of diffusion between 1014 and 1012 may be adjusted. For the preferred designs this distance is adjusted to be approximately equal to the width or pitch from one pixel to the next of pixels 1015, 1016, and 1017 which are typical pixels in the array 1018. A pair of the arcs with one concave to the right and the next concave to the left constitute one cycle of the lens surface 1000. The size and resulting lineal distance between cycles of surface 1000 may be scaled without pronounced effect on the amount of diffusion. It is preferable to scale the pattern so that, for example, ten or so cycles of the curve of 1000 may be included in the circle of intersection with a cone of rays as they are focused toward a point on the imaging surface.

Figure 11:
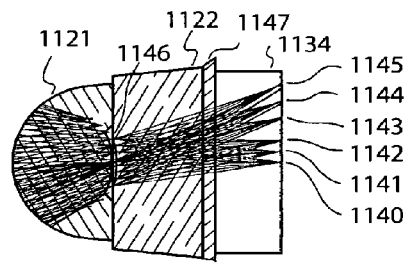
FIG. 11 depicts an image sensor having an improved optical structure.

FIG. 11 depicts a top view of the lens assembly shown in FIG. 4. The section is taken through the optical axis of the top lens 409. A top sectional view of lens 421 is shown at 1121. A top sectional view of lens 422 is shown at 1122. A sectional view of glue layer 423 is shown at 1147. A top view of filter 434 is shown at 1134. Most of the description for these parts has been given in descriptions associated with the side view of FIG. 4 and with selected front and back views of lens elements in FIGS. 5 through 8. A series of ray traces for light entering the lens at elevational angles of 0°, −3.75°, −7.5°, −15°, −20°, and −25° are depicted in FIG. 11. These rays focus at the back cover glass which is also essentially the imaging surface, respectively, at points 1140 through 1145. The narrowing of the pattern of rays due to the aperture stop is indicated at 1146.

Figure 12:
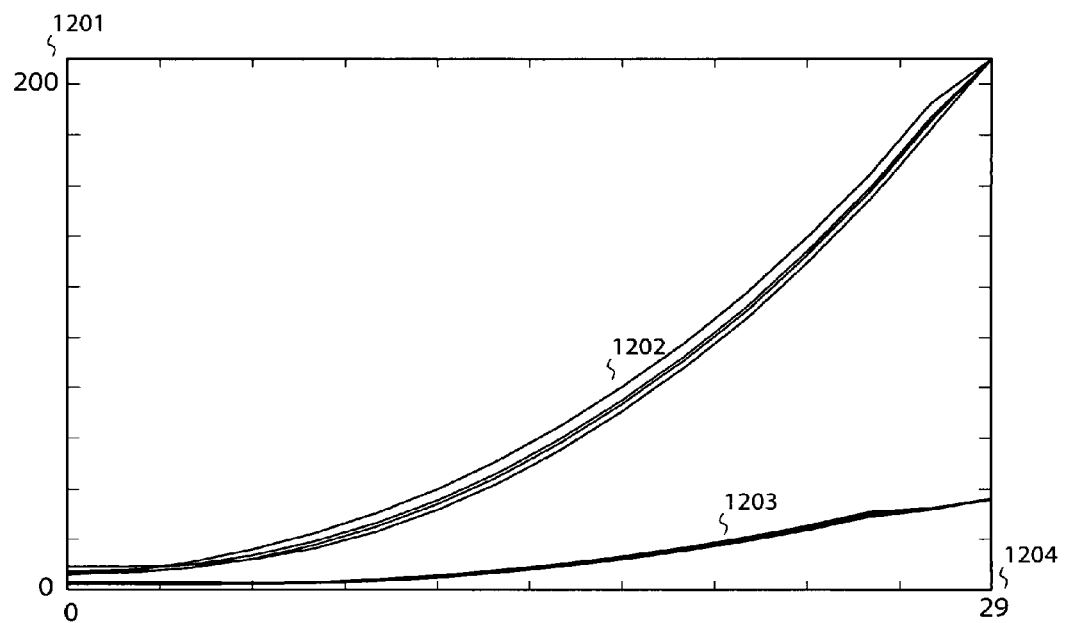
FIGS. 12-14 depict various characteristics of improved optical structure.

FIG. 12 is included to demonstrate the general benefits of the compound lens system of the present invention relative to use of a single surface acrylic lens. The close spaced packet of curves 1203 represent the RMS radius of the spot of light projected by a lens system whose design is close to that of the exemplary compound lens systems in the lens structure of FIG. 4. The angle of the entrance rays is indicated between 0° and 29° at 1204 on the horizontal axis of the graph depicted in FIG. 12. The RMS radius is indicated between 0 and 200 micrometers at 1201 on the vertical axis of this graph. Curve group 1202 is included for comparison and indicates the RMS spot radius for a lens of comparable aperture and focal length having a single surface, the entire lens being made of acrylic. Both plots were made using the ZEMAX program and the clusters of curves for 1203 and for 1202 represent the spot radii for red, green, blue, and the polychromatic combination of red, green, and blue. These four curves included in each of the clusters 1203 and 1202 are not distinguish one from another in FIG. 12 but the much tighter grouping of the cluster of curves in 1203 is one indicator of better performance of the design with the two separate, active lens materials and the added cemented lens surface. The other indicator is that the RMS radius of the spot for the exemplary design 1203 is far lower and remains very low for rays which are within 10° of the center axis of the lens.

Figure 13:
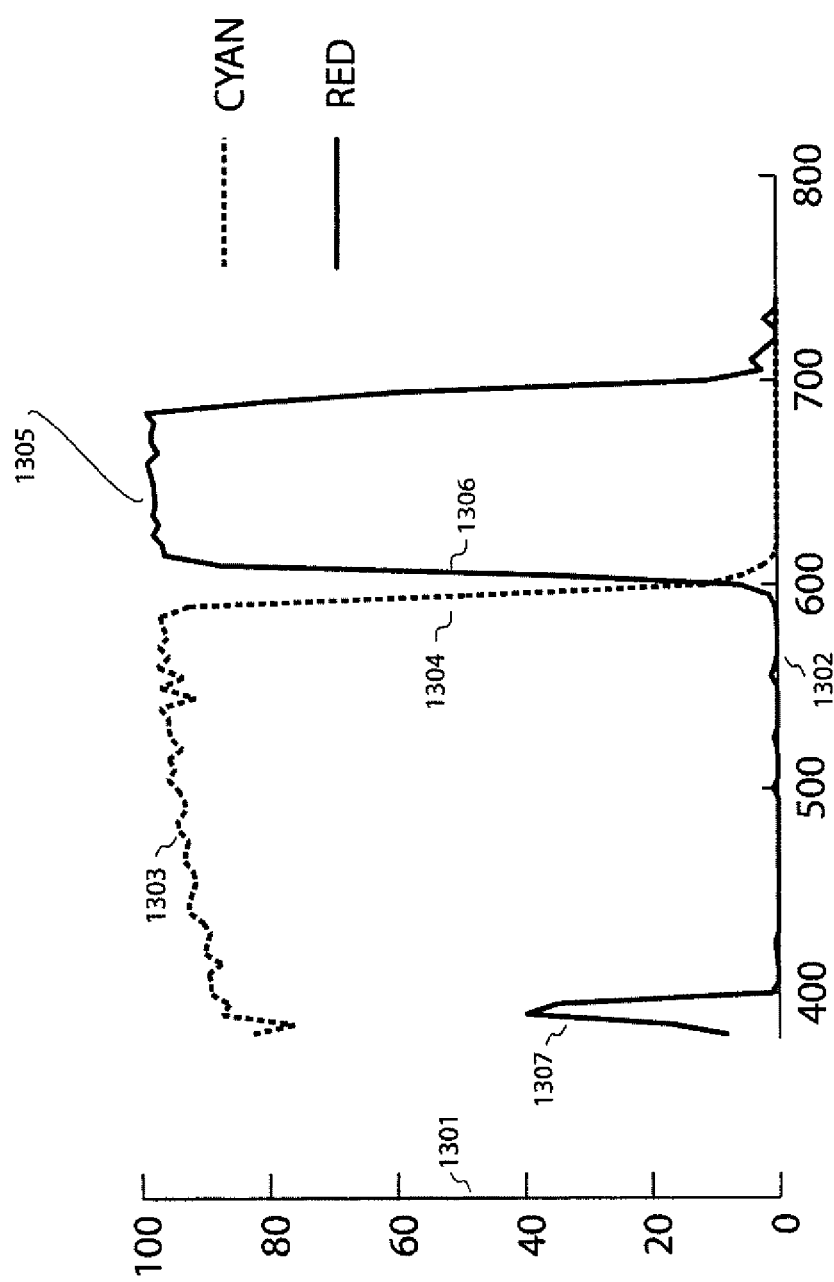

FIG. 13 is a plot of the transmission characteristic 1303 of a cyan filter and 1305 of a red filter the plots shown extend only to about 750 nm, but infrared blocking is preferably maintained to wavelengths which are long enough to prevent appreciable response of the imager to infrared light. This may require blocking to about 1300 nm. In the plot, wavelength is indicated in nanometers along horizontal axis 1302 and percent transmission is indicated along vertical axis 1301. The preferred modest gap between 50% transmission points for the red and cyan filters is indicated by the modest spacing between the 50% point at 1304 on the cyan or red complement filter transmission curve and the 50% point at 1306 on the red filter transmission curve. The sharp steep transitions between the pass band and blocking states is indicated by the curves indicating that a significant portion of this transition occurs over a narrow range of wavelengths, for example, 10 to 20 nm. The elevated transmission at 1307 for wavelength just shorter than 400 nm is indicative of the tendency of multiple layer interference filter designs to have transmission spikes in regions outside of the range of wavelengths for which they are primarily designed. In an exemplary application, the windshield is normally quite absorbing for wavelength shorter than 400 nm and the sensitivity of many solid-state imagers is also reduced in this region. In the exemplary design, it is presumed that, for these reasons, response of the rest of the system will be low enough to prevent appreciable degradation in performance due to the transmission spike at 1307. Otherwise, the design may be modified to reduce the spike 1307 or to move it to a shorter wavelength.

Figure 14:
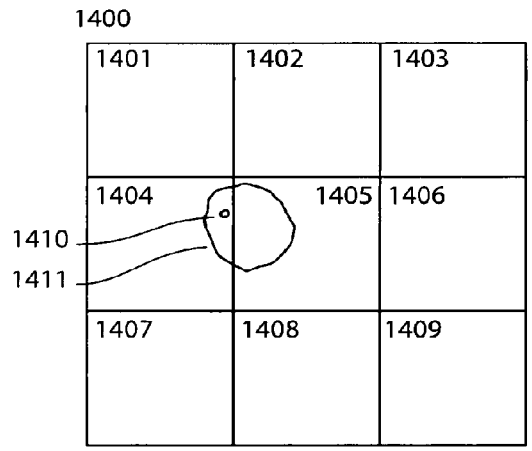
Figure 14A:
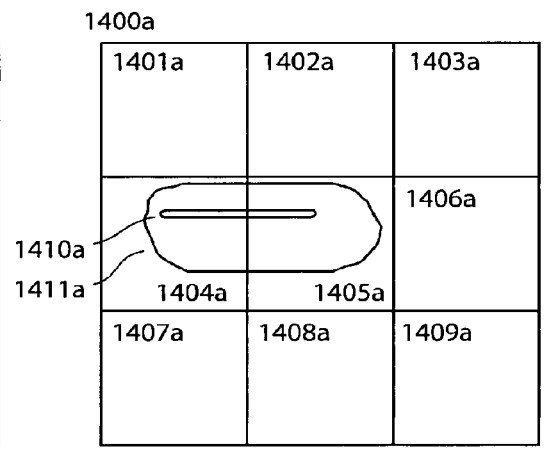

In FIG. 14, a nine pixel section 1400 having pixels 1401 through 1409 is depicted. Area 1411 represents an area of illumination which typically varies over the area 1411 created by the projected image of a distant small area light source. Spot 1410 is a very small sub-area of the projected spot image 1411. Spot 1410 is chosen so that its dimensions are very small compared to the dimensions of the pixel. In FIG. 14*a*, an optical surface such as the one described in FIG. 10 has been introduced into the optical path to uniformly spread, diffuse, or smear the image 1411 by approximately one pixel width resulting in the image 1411*a* of FIG. 14*a*. Similarly, the light which fell on the small spot 1410 of FIG. 14 is smeared into a uniformly illuminated streak 1410*a* in FIG. 14*a*. When the width of the diffusion or smear is one pixel width, the streak will also be approximately one pixel width long so that the portion of the width of pixel 1405*a* which is not covered by the streak is covered by the remaining portion of the streak in pixel 1404*a*. Assuming that the response of the pixels is linear and zero for zero light level and for this discussion that crosstalk is negligible, the sum of responses of pixel 1404*a* and 1405*a* to the light in the streak 1410*a* is substantially the same as the response that pixel 1405*a* would have to the light in this streak had it been entirely contained within pixel 1405*a* extending the entire width of the pixel. Consider now, division of the entire area of 1411 into very small area spots similar to 1410 so that the entire group of small spots is equivalent to area 1411. When the composite of all of these spots is uniformly diffused by one pixel width in the horizontal direction as in FIG. 14*a*, the sum of the response of the pixels which receive this light will remain nearly constant as the spot moves horizontally over the pixel array. The description above is not rigorous but is intended to generally demonstrate the benefit of the controlled, approximately uniform, approximately 1 pixel wide diffusion.

Figure 14B:
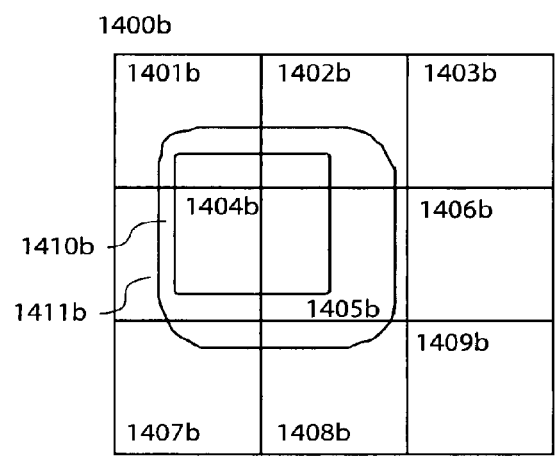

In FIG. 14*b*, a second diffusing filter has been added to receive the image diffused as shown in FIG. 14*a* to create the one pixel wide diffusion in the horizontal direction and to further diffuse the image approximately uniformly by approximately 1 pixel width in the vertical direction. The result is that the selected sub-pixel spot 1410 of FIG. 14 which became a one pixel wide streak 1410*a* in FIG. 14*a* becomes a square 1410*b* in FIG. 14*b*. Portions of the square 1410*b* are contained in pixels 1401*b*, 1402*b*, 1404*b*, and 1405*b*. If the four pixels are superimposed one on top of another, the four sections of square 1410 will fit together like pieces of a puzzle approximately filling the entire overlaid pattern but without substantial overlap one to another. This is evidence that the sum of readings from the four pixels will be nearly equal to the reading of one pixel had the square pattern projected by the diffused spot image been aligned with that one pixel.

Optionally, with a more complex diffusing filter pattern, the approximately uniform pattern extending approximately one pixel distances in the horizontal and vertical, or in the row and column directions of the pixel array or more generally and some other selected direction, may be achieved by a single optical surface. One of the desirable properties of the diffusing filters which have been described is that the filtering effect is only weakly related to the focus and the way that the lens system would project the spot when the filter is removed. This partial independence of the diffusing effect from focus and spot size is helpful in managing lens system tolerances and in maintaining the ability to make consistent spot intensity measurements in the face of changing projected position on the imaging surface, but focus and image quality are still important for image resolution and to contain the diffused spot pattern to a reasonable number of pixels. In summary the ability to substantially reduce variation in the reading of the intensity of light projected on the imager from a distant light source as the source moves by small increments in the scene causing the position of the projected image to change relative to pixel boundaries is a significant benefit.

Figure 14C:
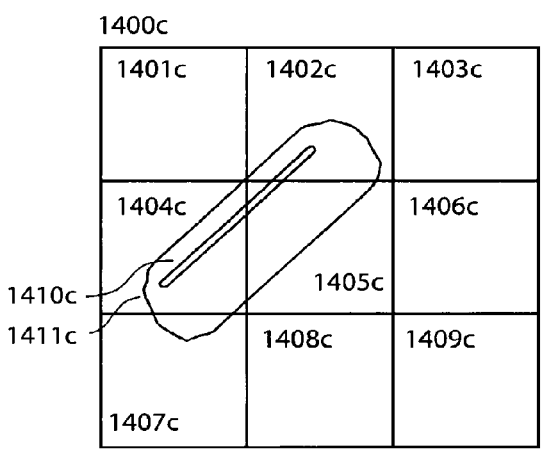

A compromise approach is indicated in FIG. 14c where the pattern 1411c is uniformly diffused in an approximately diagonal direction by an amount which is approximately equal to the pixel pitch in this direction, that is about 1.41 times the pitch in the row or column direction for a square pixel array.

Figure 15:
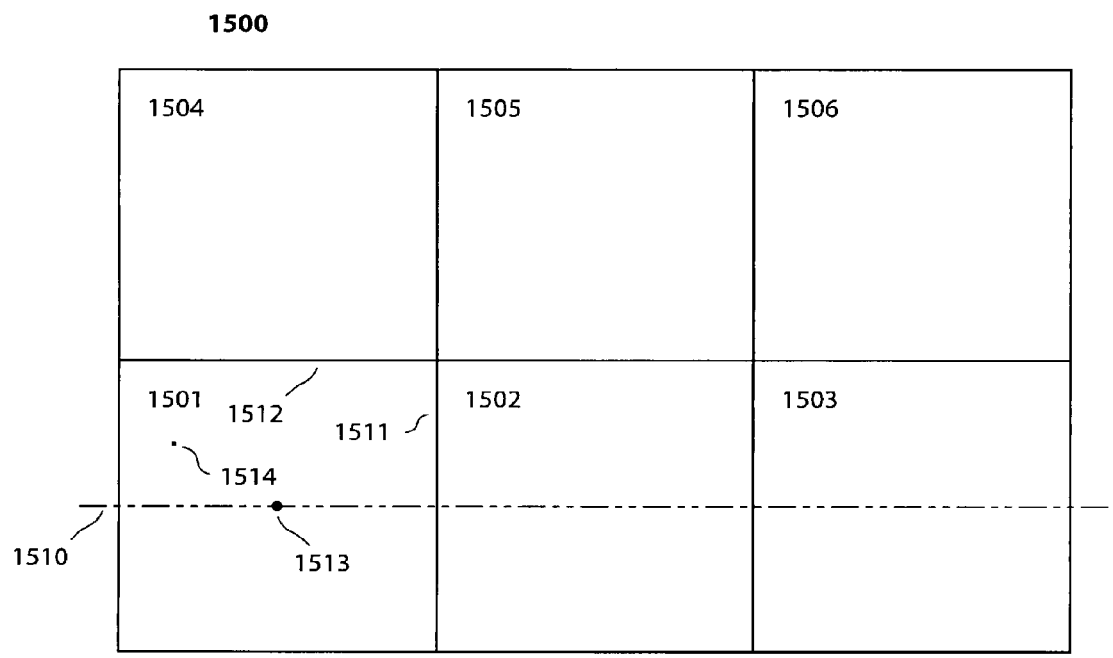
FIGS. 15 and 15a depict various embodiments of improved optical structures.
Figure 15A:
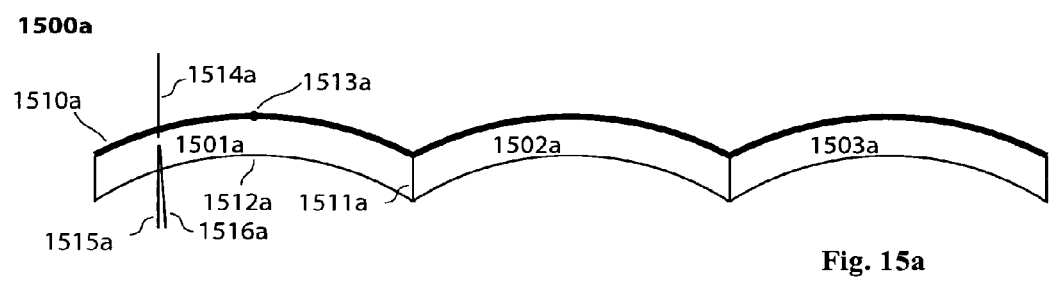

FIGS. 15 and 15a depict a lens surface configuration designed to diffuse rays passing through it approximately uniformly and by approximately equal amounts in two perpendicular directions so that a small spot is diffused into approximately a square pattern. Using this design, diffusion similar to that which is depicted in FIG. 14b may be achieved with one rather than two lens surfaces. The design is generally related to the one described in FIG. 10 except that rather than creating diffusion substantially in one direction, the surface of FIG. 15 creates diffusion in two approximately perpendicular directions. With the design of FIG. 15, paraboloids of revolution would technically be better choices for the lens surfaces than spheres and certainly may be used as part of this invention. However, since as with FIG. 10, spherical approximations to the paraboloids of revolution will function quite satisfactorily and are easier to configure and describe they are used in the exemplary design. In the exemplary design, a group of spheres having approximately equal radii are arranged with their centers equally spaced at the corners of a square grid where the distance between adjacent corners in the square grid is preferably substantially smaller than the common radius of the spherical surfaces. The array of lenses is formed by the array of spherical surfaces each bounded by its intersections with the spheres which have neighboring centers on the square array. When this array of spherical surfaces is viewed in a direction normal to the plane of the centers of the spheres, each spherical section has a square outline. The array 1500 of FIG. 15 depicts six such sections 1501 through 1506. FIG. 15a depicts a side view of features of this diffusing lens surface. Heavy line 1510a is a side or edge view of surface 1500 as it intersects the plane of section line 1510. Circular arc 1512a is the view of the arc along which spherical lens surface 1501 intersects with neighboring spherical lens surface 1504. Line 1511a is an edge view of the arc 1511 along which spherical lens surface 1501 intersects with neighboring spherical lens surface 1502. 1513 is a reference point marking the center of lens surface 1501 the corresponding center point showing as 1513a in FIG. 15a.

In a very brief explanation of how the lens works, assume that composite diffusing lens surface 1500 separates an optical medium having a lower index of refraction above it from an optical medium having a higher index of refraction below it.

Consider a ray 1514 which impinges from the top on lens element 1501 striking the surface in a direction perpendicular to the general plane of centers of the lens surfaces and therefore to the general plane of the composite lens surface. Ray 1514 is shown as ray 1514a in FIG. 15a. Were it not for the lens surface 1500, ray 1514a would continue on as ray 1515a. However, because of the effect of lens 1501, the ray will be refracted by a very small angle shown in an exaggerated view as ray 1516a being refracted generally toward the center 1513a of lens section 1501a. Because of the design and curvature of lens surface 1501a, the angle by which the ray is refracted as it passes through the lens is approximately proportional to the distance of the ray from lens center 1513a. The result is that when a uniformly distributed pattern of approximately parallel rays strike the surface 1500, the pattern being distributed over multiple lens sections of the array, the distribution of angles of diffraction as they pass through the diffusing lens surface 1500 will tend to be distributed uniformly over approximately equal increments in the horizontal and vertical direction as desired. As with the previous linear design, the solid angle subtended by the individual spherical lens surfaces may be adjusted to appropriately adjust the dimensions of the pattern of diffusion as it relates to the pixel array and the optical system. Furthermore, it is not intended that the size of individual lens sections such as 1501 in this array be related to the pixel size of the imager. Rather, their size should be such that multiple, for example six or so of the individual lens sections should fall in the focusing cone of a packet of rays from a distant light source as they are focused by the optical system onto the surface of the imager. Depending on features and requirements for the individual design, the dimensions of the individual lens sections may vary over a very wide range so that very few or very many of the individual spherical lens surfaces may be in the path of the focused cone of rays for various individual embodiments of the invention.

Figure 16:
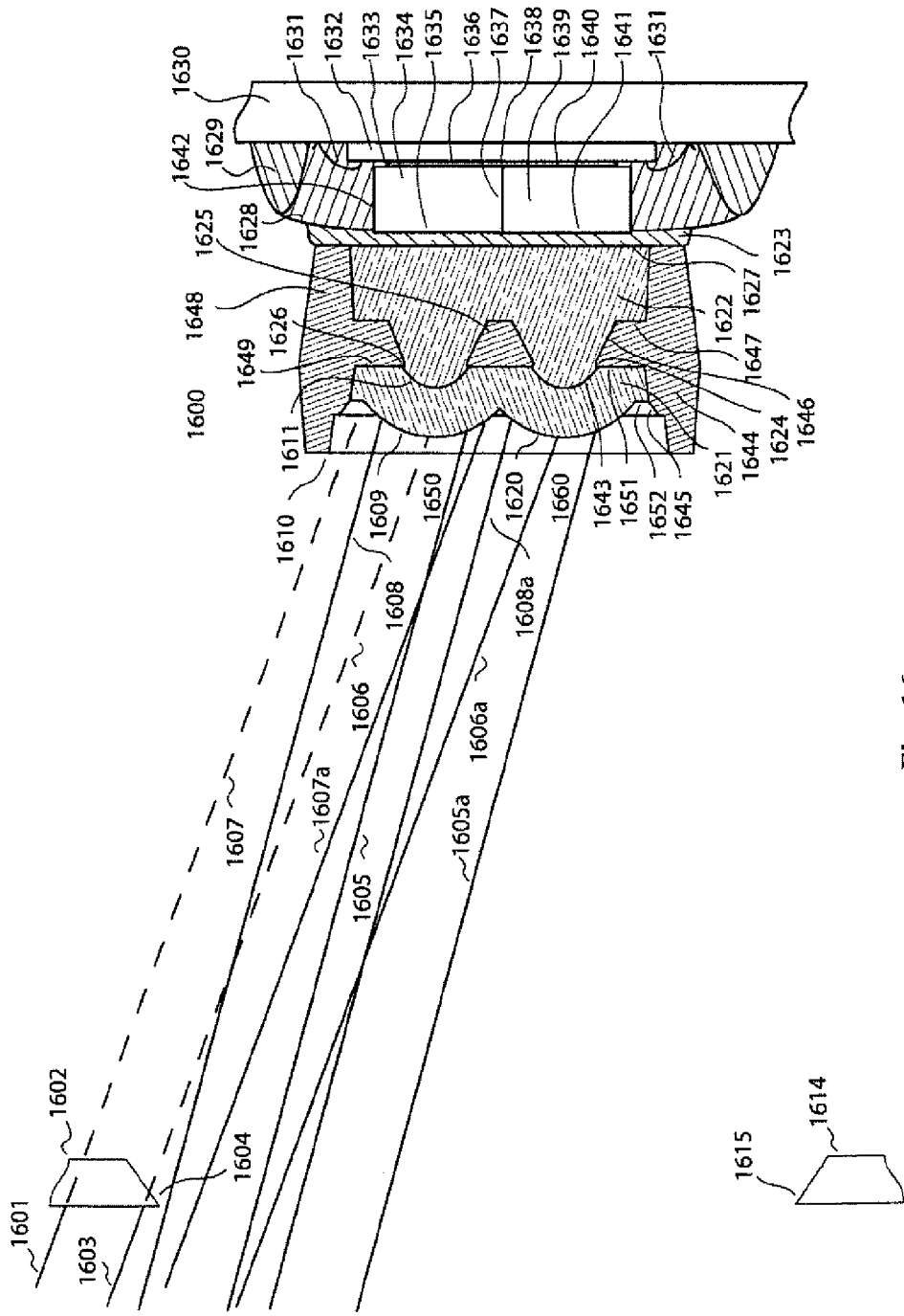
FIG. 16 depicts an image sensor having an improved optical structure.

FIG. 16 depicts a preferred embodiment which includes a combination of features which are part of this invention. Most of the features are similar to those of FIG. 4. The lens structure 1600 is the component which has been changed significantly from the structure shown in FIG. 4. In the exemplary structures of FIG. 4 and FIG. 16, lens system performance is similar, but the structure 1600 of FIG. 16 includes features which are of particular advantage in the lens fabrication process. The exemplary lens structure 1600 contains two multi-element compound lens systems 1650 and 1660. These two multi-element lens systems project similar and preferably nearly identical images of the scene through their respective color filters onto substantially non-overlapping image sensing areas of the preferably common image sensing array. Lens system 1650 utilizes lens surfaces 1609 and 1611. Both surfaces 1609 and 1611 are molded into lens member 1621. Lens member 1622 is preferably cast in place so that it also has a surface which conforms to surface 1611. Thus, optical surface 1611 is the optical interface between the lens material of member 1621 and the lens material of member 1622. Optically this combination behaves similarly to more traditional lens structures were two elements are fabricated each with a surface which, when assembled, closely conforms to the corresponding surface of the other, these two surfaces being cemented together into what is commonly referred to as a cemented doublet. Lens system 1660 utilizes lens surfaces 1620 and 1643 and lens materials in members 1621 and 1622 in a way which directly parallels the use of lens surfaces 1609 and 1611 and lens materials in members 1621 and 1622 for lens structure 1650. Surfaces 1620 and 1643 form a second lens element in lens member 1621. Thus, lens member 1621 contains two lens elements one of which is used in lens system 1650 and the other of which is used in lens system 1660. The first lens element which is used in lens structure 1650 has entrance surface 1609 and exit surface 1611 and the second lens element which is used in lens structure 1660 has entrance lens surface 1620 and exit lens surface 1643. Lens member 1622 has a lens surface conforming to 1611 which along with a portion of the relatively flat back surface 1627 forms an exit surface for the lens element. Similarly, lens member 1622 has a lens surface conforming to 1643 which along with a second portion of the relatively flat back surface 1627 forms an exit surface for the second lens element. Thus, lens member 1622 also contains two lens elements one of which is used in lens system 1650 and the other of which is used in lens system 1660. Optional rim 1652, shown in profile view, is optionally provided to form a flat surface surrounding the lenses to facilitate vacuum pickup of the part for handling and positioning of the lens members in the manufacturing process. The pickup tool will cover the lens structure, including the optical paths, when designed to engage the flat rim 1652 which surrounds the pair of lenses. In order to use the lens system or to view it, for example for positioning, the vacuum pickup tool may optionally be provided with an optically clear window through which the lens system may "look". The lens assembly may also be viewed through this same or a similar window in the vacuum pickup tool. The tool may optionally be designed to also engage the lens surfaces 1609 and 1621, preferably at their peripheries, to register and thereby facilitate positioning of the lens assembly in the pickup fixture. Lens element pair 1621 is attached to lens structural member 1644. Lens structural member 1644 is preferably an opaque, preferably black plastic piece which has multiple functions which may include positioning and attachment of lens element pair 1621, inclusion of a protective and perhaps light shrouding rim or lip 1610, and inclusion of lens stop apertures 1626 and 1624. Additionally, the structural member 1644 in combination with lens elements 1621 forms a cavity into which a transparent material may be dispensed and solidified to form the second lens elements 1622, one for the lens system 1650 which has entrance surface 1609 and one for the other lens system 1660 which has entrance surface 1620. The optical glue or other transparent material used to cast or otherwise fabricate lens member 1622 conforms and adheres to lens surfaces 1611 and 1643 of molded lens element structure 1621.

In the simplified drawing of FIG. 16, some of the sections particularly of lens members 1621 and 1622 depict only surfaces cut by the section since inclusion of lines visible back of this section would be confusing in the drawings. The embodiment of FIG. 16 is based on an exemplary application of the pair of compound lenses or lens systems in the dual lens structure to project two separate images each through its own color filter onto its own separate area of the imaging sensor to enable red/non-red color sensing to be used as part of the control function in an exemplary design. A baffle system shown in fragmentary view as members 1602 and 1614 is used to shield the optical system from stray light and to prevent troublesome overlap of the projected images. This baffle system and the dual imaging system are generally described in commonly assigned patents and patent applications incorporated by reference elsewhere herein. In a novel configuration the two compound lenses used in the optical system each contain at least two elements which are utilized to partially correct chromatic aberration, to increase the usable field of view, and to substantially improve overall lens system performance.

The lens structure is positioned and cemented by glue layer 1623 to the combined filter and imager window 1642. The window 1642 covers imaging area 1636 which images the top image and imaging area 1640 which images the lower image. The imaging areas are part of the solid-state imaging array 1632. The array is preferably mounted to a circuit board or other substrate shown in fragmentary view as member 1630. Lead bond connections, two of which are depicted at 1631, electrically connect the imaging array 1632 to other portions of the circuit. The chip 1632 which contains the imaging array may also perform a number of the control and signal processing steps required by the imaging function. The substrate and circuit connection members of which 1630 is representative are shown in a very simplified view and include required peripheral components and provide connections to receive power and imager control commands and to communicate signals from the imaging system to other members of the overall control system.

In FIG. 16 the transparent cover 1642 is preferably cemented with transparent glue to the imaging array of 1632 so that it covers the pixel sensing area. A ridge 1629 of viscous, thixotropic material is dispensed around the periphery of the imaging device preferably being placed outside of the lead bond area and a more fluid material 1628 is dispensed in the moat which remains between the cover glass 1642 and the dam or other retaining member 1629. The glue in this assembly is cured, perhaps in multiple steps.

In the exemplary design, the field of view for the sensor extends approximately from minus 15° to plus 15° in the elevational direction and from minus 25° to plus 25° in the horizontal direction. Rays 1605 and 1608 depict the lower and upper boundaries of a packet of rays from a distant source with an elevational angle of approximately 15° which enter lens surface 1609 are focused through the lens surfaces 1609 and 1611 through transparent glue layer 1623 through red filter surface 1635 through side 1634 of cover glass assembly 1642 and finally focus on imaging surface 1636 of imaging device 1632. A similar packet of rays from the same scene bounded on the lower side by ray 1605*a* and on the top side by ray 1608*a* enter lens surface 1620, travel through a path which generally parallels the optical path of the upper compound lens system, pass-through cyan filter surface 1641 through portion 1639 of transparent cover assembly 1642 and finally focus on imaging surface 1640 of imaging device 1632.

The baffle arrangement is generally described in many of the commonly assigned patents and patent applications incorporated by reference elsewhere herein. Rays 1601 and 1603 are blocked by baffle portion 1602. Otherwise they would continue on as rays 1606 and 1607 and focus on a point below the lower part of the upper image area 1636 possibly falling on the upper portion of lower imaging area 1640. A narrow area 1638 is provided between active imaging areas 1636 and 1640 in order to provide a tolerance zone for rays which enter through lens surface 1609 and are focused just a little below the active area of imager zone 1636 which is provided to register the image focused by the top compound lens system. Analogously, rays which enter lens surface 1620 and are focused just a little above the active area of imager zone 1640 will also fall on the area 1638 between the active areas 1636 and 1640.

The lens system was modeled using the ZEMAX®-EE Optical Design Program, which was released on Nov. 12, 2005 from Zeemax Development Corporation. It is presumed that someone undertaking a similar lens design will proceed from an appropriate starting point and supply specific lens material refractive properties. Thus, only partial details will be given to provide a reasonable starting point for such a design. Light Weld® 429 from Dymax Corporation was chosen to model the optical system in the exemplary design. Preliminary measurements on index of refraction versus wavelength indicate an Abbé number of about 46 and an index of refraction of about 1.51 for the cured 429 material. This is lower than the Abbé number of approximately 55 typical for materials such as acrylic. A range of materials with generally higher Abbé numbers ranging from 46 to 65 or so were substituted for the Light Weld® 429 material in the lens design program. Modest adjustments in focal length, lens curvature, lens aspheric or conic constants, and lens element thicknesses were generally needed to re-optimize lens system performance to accommodate these changes in optical material. The general results were that with these normally modest design adjustments, optical performance which was generally comparable to that of the exemplary system was obtained. The glue which is used to fabricate lens member 1622 is preferably selected to have a relatively low dispersion (high Abbé number). The glue forms a lens element which functions much like a cemented doublet with lens member 1621 which is preferably fabricated of a material such as polycarbonate which has the higher dispersion (lower Abbé number). As test results from sample parts become available, the lens material data will be reviewed and refined as necessary with the refined data being used in conjunction with the lens design program to make appropriate refinements to the lens prescriptions and their associated lens designs. The glue 1622 is preferably cured prior to aligning and mounting lens structure 1600 to the imaging array using glue layer 1623. The glue layer 1623 is preferably made of the same material as lens member 1622 so that irregularities in surface 1627 will be blended out by nearly identical optical properties of layer 1622 and 1623. Other options are within the scope of the invention. For example, separate glue layer 1623 may be eliminated and the volume of the glue material 1622 may be increased to use it to bind directly to the imaging assembly. The limitation of this procedure is that there is normally substantial shrinkage and also significant change in the index of refraction in the glue material as it cures, the shrinkage in the much heavier layer of glue as it cures will potentially cause misalignment and/or defocus of the lens systems with the imager and the change in index of refraction will also change optical properties after cure. One option which may be applied with various fabrication options is to adjust the position of the lens assembly 1600 to compensate for changes in dimension and other optical properties as the glue cures. It is preferable even with smaller overall dimensional changes which result from curing the relatively thin separate glue layer of 1623 to also set focal distance and alignment to compensate for the change in dimensional and optical properties of the glue as it cures thereby providing proper alignment and focus of the lens systems with the glue in its final cured state. The filter is modeled as Schott Borofloat33® which has a nominal refractive index of 1.47.

Lens systems 1650 and 1660 are preferably optimized for the specific ranges of wavelengths which are transmitted by their associated color filters. However, with the relatively good color correction inherent in the exemplary design, optimization for specific but differing color ranges will in many instances result in minor design modification and the lens systems 1650 and 1660 may reasonably and optionally be designed to the same prescription. Preferably, focus is individually adjusted for each of the images by slightly tilting the lens structure if necessary to change the focus of one lens system relative to the other and thereby achieve proper focus for each image. Lens parameters are in millimeters and specified in the form used by the ZEEMAX® program. Lens element thicknesses are specified along the center axis of the compound lens. The prescription data which follows is given as an example and other designs including various aspheres and other design modifications are within the scope of this invention. Surface 1609 is an ellipsoid with a nominal radius of 1.75 mm and a conic constant of −0.28 and the thickness from 1609 to 1611 is nominally 1.04 mm. Here, the lens elements having the lower Abbé number (elements in piece 1621) have a thickness (1.04 mm). This thickness is significantly less than the radius (1.75 mm) of the front lens surface. With the high dispersion (low Abbé number) material on the scene side, a lens element thickness of about six tenths of the radius of the first scene side optical surface in the lens system is a good starting value to proceed with optimization. The thicknesses for the lens elements with entrance surfaces 1609 and 1620 are two of the variables which should preferably be adjusted for each design to enable the lens surfaces at the interfaces between the materials of lower and higher Abbé numbers to provide a near optimal combination of color correction while enlarging the field of view over which relatively low lens system aberrations are maintained. The radii of the second surfaces (1611, 1643) relative to the radii of the first surfaces (1609, 1620) are chosen primarily to achieve good color correction. With the radii of the first surfaces relative to the second surfaces chosen for good color correction, the radii of the second lens surface (1611, 1643) at the interface between the two optical materials will typically be less than the radius of the entrance surfaces (1609, 1620) of the lens systems and for example may be in the range of approximately three fourths to less than half of the radii of the entrance lens surface (1609, 1620). The back lens surfaces (1611, 1643) of the polycarbonate lens elements (also the front lens surfaces of the conforming lens elements of cast block 1622) is an ellipsoid with a radius of 0.67 mm and a conic constant of −0.425. In this example, conic constants were used to introduce non-spherical lens shapes into the design. Other methods of introducing and specifying non-spherical surfaces such as the use of polynomial terms may optionally be used. In this design, the use of non-spherical lens surfaces did lead to considerable improvement over the use of spherical lens surfaces alone. As with most optical designs, the lens prescription parameters are highly interactive and for any change in a particular parameter it is often preferable to adjust values of other parameters to optimize overall performance of the lens system.

In the exemplary design, the aperture stops (1626, 1629) are provided by apertures or openings in preferably opaque member 1644 and are preferably placed so that they are nearly coplanar with the boundaries of lens surfaces 1611 and 1643 and preferably so that they also shadow the edges of lens surfaces 1611 and 1643. The stops each have a nominal radius of 0.66 mm. The outer diameter of each of the lens surfaces (1611, 1643) are preferably made a little greater than the diameter of the respective stop and positioned relative to the respective stop so that light passing through the stop and focused onto the imaging array passes through well formed portions of the lens surface. With the aperture stop radius of 0.66 mm, the F number of the exemplary lens system is approximately 2.2. This effective F number can be changed by a new selection of aperture stop radius. For a given selection of the aperture stop radius, the radii of the lens surfaces in the lens system are preferably chosen so that a substantial portion of the light which passes through the aperture of the lens system also passes through the properly formed lens surfaces rather than passing through zones of distortion either at the edge of or bypassing one or more of the lens surfaces altogether. The nominal combined thickness of the Dymax Light Weld® 429 lens element, the polycarbonate lens block 1622, and optionally separately applied glue layer 1623 measured from the center of lens surface 1611 to filter surface 1635 is nominally 3.32 mm (This will vary when proper focus is set.). Compatibility of plastic materials is preferably verified both in cured and uncured states. In addition to material clarity, humidity absorption, yellowing with age, UV exposure, or elevated temperature exposure, and the like, attack of mating plastics in the uncured state may limit use of some glues and or place restrictions on the time that the glue may be left in the uncured state. The nominal thickness of the filter and cover glass 1642 is 1.4 mm. The surface of the imager is preferably very close to the cover glass and is preferably also glued to the cover glass. With the design just described, the front lens surfaces 1609 for the one lens system and 1620 for the other lens system are the only material to air interfaces in the optical paths through the lens systems. Preferably each multi-element lens structure has only one surface with an air interface in the path from the first surface of the lens system through to the imager. This construction for which each lens system has multiple, substantially non-planar (i.e. surfaces characterized by a radius which is substantially different from infinity) active optical surfaces with only one surface which interfaces with air helps to minimize surface contamination and reduces surface reflections even without use of antireflection coatings at the non-air interface surfaces.

The cover assembly 1642 preferably contains two filter sections 1635 and 1641 and is preferably made of glass or other transparent material. These filters may be deposited using a patterning process thereby using a single piece of glass or other transparent material for 1642. Optionally, cover glass assembly 1642 may be made of two separate blocks of transparent material placed next to each other such that 1634 and 1639 are separate blocks of transparent material. Each of the separate blocks of glass or other transparent material may then be cut from a larger sheet with a single filter coated on the surface and or incorporated as part of the bulk transmission characteristic of the material eliminating the need to pattern the filters. Optionally, the material in the transparent cover pieces may be chosen or designed with bulk filter characteristics which replace or supplement the coated filters on either or both of the filter sections. Filter surface 1635 is preferably placed on the face of transparent cover material section 1634. This filter may, for example, be a red transmission filter with an infrared blocking capability as detailed in FIG. 13. Filter surface 1641 is preferably placed on the face of transparent cover material section 1639. This filter may, for example, be a cyan transmission filter with an infrared blocking capability as detailed in FIG. 13. When needed the air interface or even additional optical surfaces may be coated with antireflection coatings.

Figure 17:
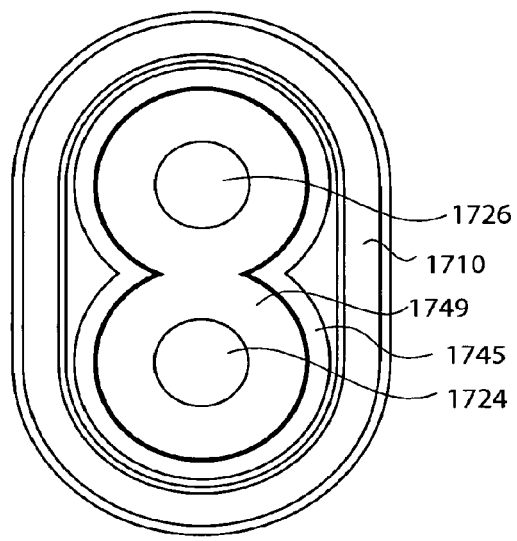
FIGS. 17-21 depict various embodiments of improved optical structures.

FIG. 17 is a front view of the structural member 1644 of lens assembly 1600 which is depicted in FIG. 16. Openings 1726 and 1724 are the lens aperture openings which appear in edge view at 1626 and 1624 in FIG. 16. Rim 1710 preferably protrudes beyond front surfaces of the lens systems to provide mechanical shielding of the lens systems and optionally to shield the lens surfaces from stray light. This corresponds to protruding rim 1610 of FIG. 16. 1749 is the ledge corresponding to 1649 on which the lens element pair 1621 is seated. 1745 is a preferably tapered surface corresponding to 1645 of FIG. 16 which preferably surrounds the lens member mounting area to facilitate assembly and provide clearance for flash around the lens member which might otherwise interfere with proper seating of the lens member.

Figure 18:
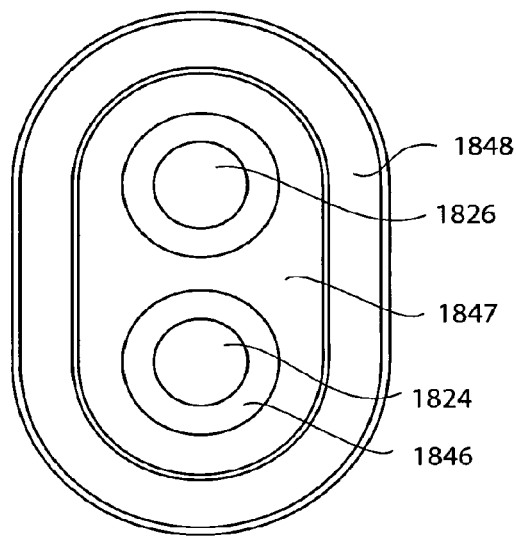

FIG. 18 is a back view of the structural member 1644 of lens assembly 1600 which is depicted in FIG. 16. Openings 1826 and 1824 are the lens aperture openings which appear in edge view at 1626 and 1624 in FIG. 16. Rim 1848 preferably protrudes in back of the lens member to provide a cavity into which lens material 1622 of FIG. 16 may be placed. This protruding area is depicted by portion 1648 of member 1644 in FIG. 16. 1847 is the ledge corresponding to 1647 which serves as a transition area between areas of the cavity of which are associated with individual lens elements and the common portion of the cavity. 1846 is a preferably tapered surface corresponding to 1646 of FIG. 16. This region which may be conically shaped is the portion of the cavity which is filled with the transparent lens material and provides for unobstructed passage of light through lens surfaces 1611 and 1643 and on through transparent cement layer 1623 in its path to the imaging surface.

Figure 19:
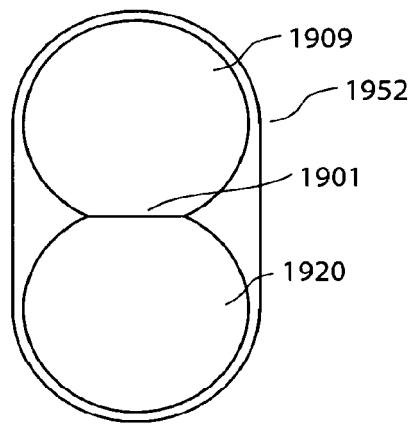

FIG. 19 is a front view of dual element lens member 1621 which is shown in a sectioned side view in FIG. 16. Surface 1909 is depicted in a profile view as 1609 and surface 1920 is depicted in a profile view as 1620 in FIG. 16. The two lens surfaces intersect one another and are joined along 1901. Rim 1952 corresponds to rim 1652 in FIG. 16 and is optionally provided to facilitate pickup and handling of the part with a vacuum tool.

Figure 20:
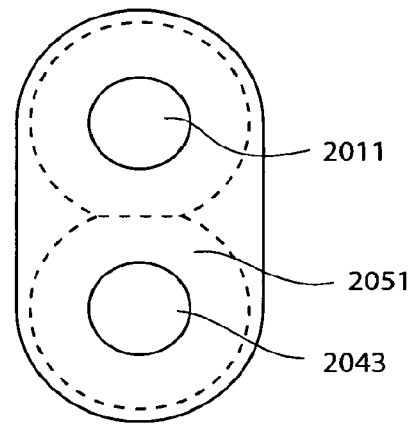

FIG. 20 is a back view of dual element lens member 1621 which is shown in a sectioned side view in FIG. 16. 2051 is the back surface of the lens member and corresponds to 1651 shown in edge view in FIG. 16. Lens surfaces 2011 and 2043 correspond to surfaces 1611 and 1643, respectively, in FIG. 16.

Figure 21:
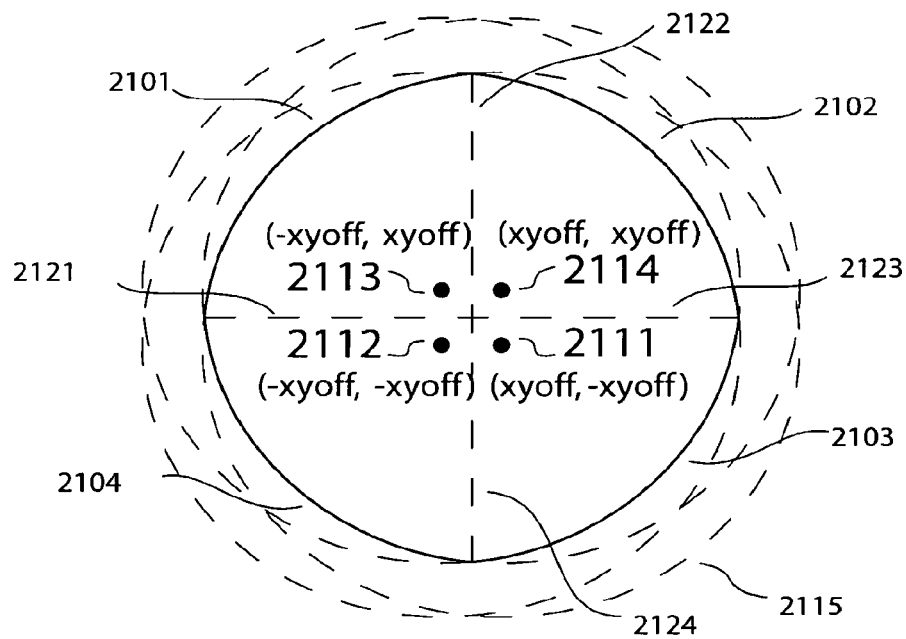

FIGS. 6a, 8, 10, 14, 14a, 14b, 14c, 15, and 15a along with their associated description all include provision for some sort of diffusion. An alternate method to create diffusion will be described here with reference to FIGS. 21 and 22. The approached to be described to provide the controlled diffusion may be applied to the lens structure of FIGS. 16 through 20 and FIG. 25 through 27 and may optionally be used in other structures. Because of certain constraints and advantages in the configurations depicted in FIGS. 16 and 25, this approach is particularly well adapted to be applied to a lens structures which generally conform to the teaching associated with FIGS. 16 and 25. The approach takes advantage of several features of the lens configurations of FIGS. 16, 25 and 30 and various features of the invention to be described may be used in combination as described or in many instances may be applied separately. In the exemplary application of the diffusing structure, it is assumed that lens surfaces 2011 and 2043 of FIG. 20 (lens surfaces 1611 and 1643 of FIG. 16) are replaced by the modified lens surface which will be described in connection with FIG. 21. In the particular example lens surfaces 2011 and 2043 of FIG. 20 are concave so that the mold surface used to produce each of them is a generally convex surface. For the exemplary structure, the centers of revolution of various portions of the lens surface are offset one relative to another. It is preferable that these offsets be configured such that the surface of the mold is conveniently machinable. The preferred way to machine the mold surface is to use a precision lathe which employs what is referred to as a single point diamond tool to machine the surface. In the exemplary embodiment of FIG. 21, four centers 2111, 2112, 2113, and 2114 are used as the respective centers of rotation to machine portions of the mold for the lens surface. These portions are bounded by arcs 2101, 2102, 2103, and 2104, respectively. The centers may, for example, be offset by the four combinations of plus and minus xyoff as is depicted in FIG. 21. In FIG. 21, xyoff has been greatly exaggerated for pictorial clarity and may, for example, be 23 μm or more generally in the range of 2 to 100 μm. More generally, the offsets do not need to be the same in the x and the y directions and may even have different magnitudes for different points in the same direction. Furthermore, differing numbers of centers may be used. In general, the magnitude of the offsets is preferably selected to create the desired degree of diffusion which is preferably chosen to correspond to the dimensions of the pixel array and the pixel pattern to be covered by the diffused pattern as has been described elsewhere in this specification. Dashed circular arc 2115 is the continuation of arc 2101 which is the outline of a portion of the lens surface. The other circular arcs similarly shown as dashed lines are continuations of remaining arcs 2102, 2103, and 2104 which are associated with the remaining portions of the lens surface. These dashed line circular arcs illustrate how the path of the cutting tool removes material from the intended quadrant and misses the remaining three quadrants. By repositioning the mold surface on the lathe head prior to machining each lens section, the mold for a lens with discrete but very modestly offset lens sections is formed. In the illustrative example which has four sections, the lens surface is divided into four quadrants. The section bounded by arc 2101 is separated from the section bounded by arc 2102 along a boundary depicted by dashed line 2122. Likewise, dashed lines 2123, 2124, and 2121 separate the three remaining adjacent pairs of lens surfaces or sections.

In an exemplary embodiment, the lens modification generally described in FIG. 21 was designed such that only lens surfaces 1611 and 1643 of FIG. 16 are replaced by lens surfaces modified to introduce controlled diffusion as detailed in connection with FIG. 21. xyoff was chosen experimentally as 23 μm which results in the centers of the respective lens surface quadrants falling on corners of a square which is 46 μm on a side. This was the offset value which resulted in the desired amount of diffusion. In the exemplary design, the lens element thickness from 1609 to 1611 remains the same as for the design detailed in FIG. 16. The radius and aspheric constant of lens surface 1609 is also unchanged from FIG. 16. As a starting point to develop the lens system with the desired diffusing property, the original prescription given previously for surface 1611 was initially unchanged except for the addition of the relative offsets of the quadrants of the lens surface as described in connection with FIG. 21. The focal distance was adjusted to optimize performance of the modified lens system. The modified system was then further refined and minor adjustments were made to the lens prescription for lens surfaces 1611 and 1643. The radii of these surfaces were increased from 0.67 mm to 0.71 mm and the conic constant was decreased in magnitude from −0.425 to −0.375. The thickness of lens member 1621 was left unchanged at 1.04 mm, and the lens system was refocused for optimal performance resulting in a modest increase of about 0.05 mm in the combined thicknesses of potted element 1622 and associated glue layer 1623 as compared with the nominal focal distance for the design of FIG. 16.

Figure 22:
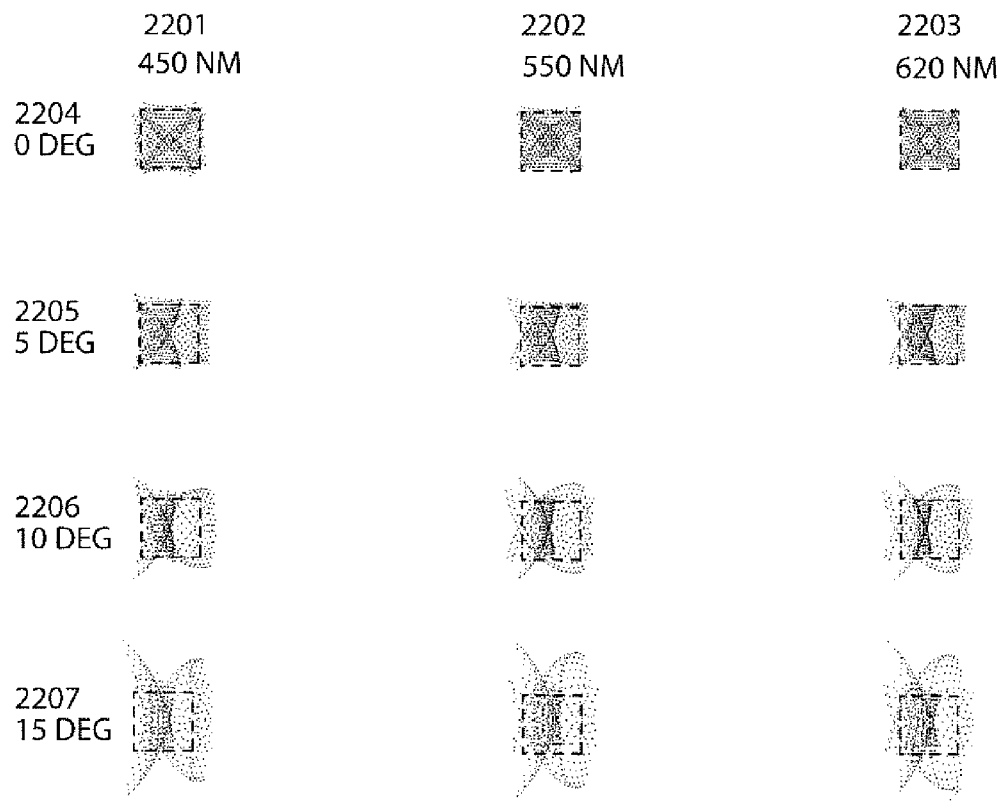
FIGS. 22 and 23 depict various characteristics of improved optical structure.

FIG. 22 illustrates performance of the lens system in imaging a distant point source object as modeled by the Zemax program. The spot diagrams are shown in matrix form with spot diagrams in column 2201 illustrating performance for a 450 nm light source, spot diagrams in column 2202 illustrating performance for a 550 nm light source, and spot diagrams in column 2203 illustrating performance for a 620 nm light source. Spot diagrams in row 2204 illustrates performance for a distant point light source which is on the center axis of the lens system and spot diagrams in rows 2205, 2206, and 2207 illustrate performance for distant point light sources which are off of the center axis of the lens system by 5°, 10°, and 15°, respectively. The dashed line squares shown for each of the pixels in the matrix are for reference only and are nominally 15 μm on a side. The alignment with the spot images is for reference and is not meant to imply that projected images of distant light sources will somehow align themselves with individual pixels in the imaging array. The description associated with FIGS. 11 through 11c indicates that it is generally desirable to design the optical system such that the projected images of distant small area light sources are related in a generally prescribed way to the size and/or configuration of pixels in the imaging array. Characterization of the lens system to diffuse the projected image of a distant point source so that the diffused pattern approximately matches the size and shape of pixels in the array is one objective which is beneficial for certain applications. For other applications, specific details of the intensity distribution of the pattern of diffusion and particular patterns of response of the imager may make it desirable to modify the size and or shape of the desired pattern of diffusion. Such modifications are considered to be within the scope of this invention. When color filter arrays are employed, this technique may be extended to diffuse the image over a pattern which is related to the size and shape of a prescribed group of pixels in the color filter array. For example, with a conventional Bayer pattern, the pattern may be extended to approximately cover a two pixel wide by two pixel high area which corresponds to the grouping of one red, one blue, and two green pixels in the Bayer pattern. This might be achieved by increasing xyoff in the exemplary design. For color filter arrays which employ other filter patterns such as red, green, and blue stripes, the pattern of diffusion may be nonsymmetrical and for example may be rectangular, for example for a striped pattern of horizontal red, green, and blue stripes which each filter light which is projected to an associated horizontal row of pixels, the pattern of diffusion might be one pixel wide by three pixels high. This might be achieved by increasing xyoff selectively for the vertical or y direction offsets leaving the horizontal or x direction offsets nominally at the value which yields the one pixel wide pattern. The exemplary design whose performance is depicted in FIG. 22 is targeted for an imager that has a 15 μm pixel pitch in the horizontal and vertical directions. Following a line of reasoning similar to that presented in the discussion associated with FIG. 11b, it was concluded that the projected image of a distant small area point light source should be diffused over an area which nominally matched the size of individual pixels. The simulated results presented in FIG. 22 indicate that the exemplary design is capable of achieving diffusion of an approximately desired size and pattern over an appreciable field of view and also over an appreciable range of wavelengths.

Several features of the design which was specified in FIGS. 21 and 22 will be described. In the exemplary design, the lens surfaces which were modified to create the diffusion are concave requiring a convex mold surface to produce them. In order to machine the mold with a lathe, the centers for individual sections of the lens surface were positioned in a way which reduced the average radius of the composite lens surface as compared with the turned radius of individual lens sections. To provide similar diffusing effects for other designs, such as the one illustrated in FIG. 30 which incorporate a convex lens surface, a similar machining process may be used but the coordinate values for respective center offsets are preferably changed in sign so that the sections of the lens surface are modestly spread apart rather than being placed in closer proximity to one another with the result that the average radius of the composite lens surface is increased relative to the turned radius of the individual lens sections.

A second feature of the lens surfaces 1611 and 1643 chosen for modification to provide the controlled diffusion is that they are very close to their respective lens aperture stops at 1626 and 1624. Because of this close proximity of the surfaces which are modified to create the diffusing effect to each to its respective lens stop; the region of the diffusing lens surface through which light passes as it emanates from a given area in the scene, travels through the lens system, and is projected onto the imaging surface is relatively non-variant as a function of the position of the given area in the scene. Stated another way, with the given lens surface which creates the diffusing effect placed in close proximity to the lens stop, for a substantial given portion of the scene, light from objects within this given portion of the scene which strike the lens system illuminate the given lens surface which causes the diffusing effect in a relatively uniform way so that the diffusing effect is relatively uniform for the projection of light from any object which is positioned in the given portion of the scene. In a preferred design, a single set of lens surface features which covers a substantial portion of the associated lens surface is provided to create an approximately uniform diffusing effect for light coming from objects within a substantial portion of the scene.

To make this clearer, consider the contrasting case when the lens surface which causes the diffusing effect is moved quite far from the stop and quite close to the imaging surface. In this case light from a small area source in the scene is only modestly out of focus when it passes through the surface which causes the diffusing effect. This has two consequences. First, light focused from any small area object in the scene will be concentrated on a relatively small area of the diffusing surface which is placed close to the imaging plane. Secondly, the location of this projected image of a small area source in the scene as it passes through the diffusing surface will vary substantially depending on the location of the source within the scene. With the lens surface feature which causes the diffusing effect placed at a substantial distance from the lens aperture stop, the usual consequences are that the feature which creates the diffusing effect must be small relative to the size of the associated lens surface and similar or functionally equivalent diffusing patterns need to be replicated a number of times to cover the entire active diffusing surface to make the diffusing effect consistent for light coming from a variety of places from within the scene. This is in contrast to the preferably single set of features which cover substantially the full area of the projected image preferably close to the aperture to create a diffusing effect which is effective over the entire range of focus and which is also effective for light projected from substantially any area of interest within the scene.

Figure 23:
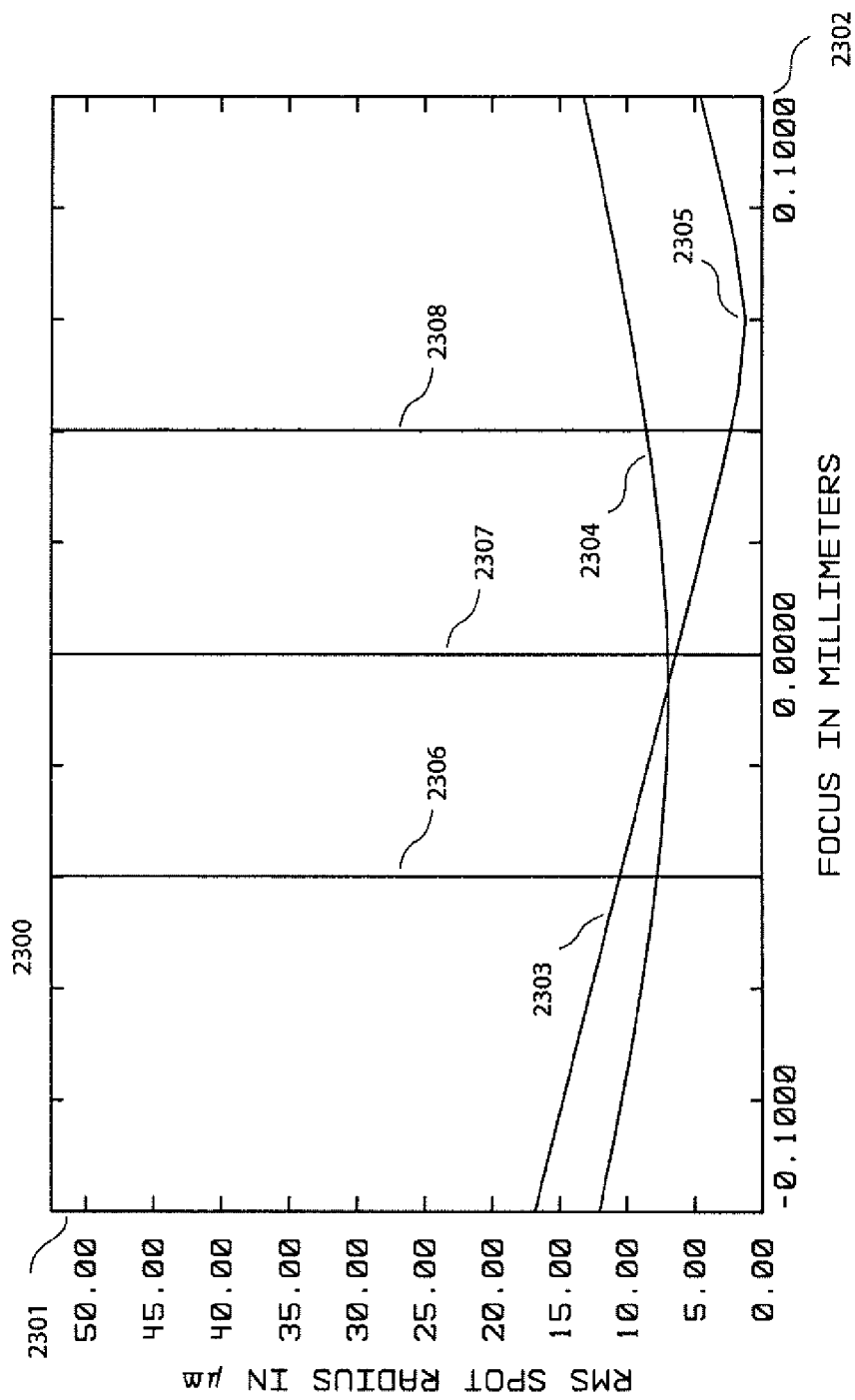

In FIG. 23 a plot 2300 indicates RMS spot radius in micrometers on the vertical axis 2301 versus effective relative focal distance in millimeters as indicated on the horizontal axis 2302. Curve 2303 represents the sharp focus design of FIG. 16 while curve 2304 represents the modified design of FIG. 16 or 25 as modified by the diffusing lens structure described in FIGS. 21 and 22. The relative focus is depicted with nominal correct focus for the application at 0.0 mm in the center. The relative focus as depicted varies from −0.1 mm on the left to plus 0.1 mm on the right. One option is to use a sharp focus lens system with a focus as generally indicated for curve 2303. This lens system has been defocused to create a diffusing effect and sharp focus occurs at 2305. Vertical line 2307 indicates nominal best focus for the application while vertical lines 2306 and 2308 indicate the lower and upper bounds of the general range over which effective focus may be expected to vary due to temperature excursions over the automotive operating temperature range. Other effects from factors such as variation in humidity, aging, variation in the initial focal adjustment, and variation in focus over the field of view all add even greater tolerance (not depicted) to the indicated tolerance range. Over the automotive temperature range, for the illustrative example, the effective focus of the initially defocused sharp focus lens system represented by 2303 will vary from being seriously out of focus to being near sharp focus. The resulting performance even over this normal temperature range will vary considerably as a consequence. The diffusing effect used in the modified design represented by curve 2304 is relatively independent of focus and creates a relatively broad relatively flat bottom in the curve 2304 which represents the RMS spot radius versus relative focal distance. The result is that the RMS spot radius remains much more nearly constant over the expected range of operation. Furthermore, for the controlled diffusing effect, as demonstrated by the spot patterns of FIG. 22, both the shape and size of the diffusion pattern are characterized for improved performance in the application. Additionally, defocus of the sharp focus lens system does not generally serve to characterize the shape of the spot for the intended application.

In a number of the exemplary designs, the aperture stop is placed close to an interior lens surface in a compound lens design rather than being placed close to the entrance lens surface as was done in a prior art design. This placement of the stop close to the interior lens surface reduces the required diameter for the interior lens surface for a given F number rating of the lens system. The placement also improves tolerance to misalignment of the lens surfaces and also makes it possible to place the lenses closer together in dual or multiple compound lens designs.

Figure 24:
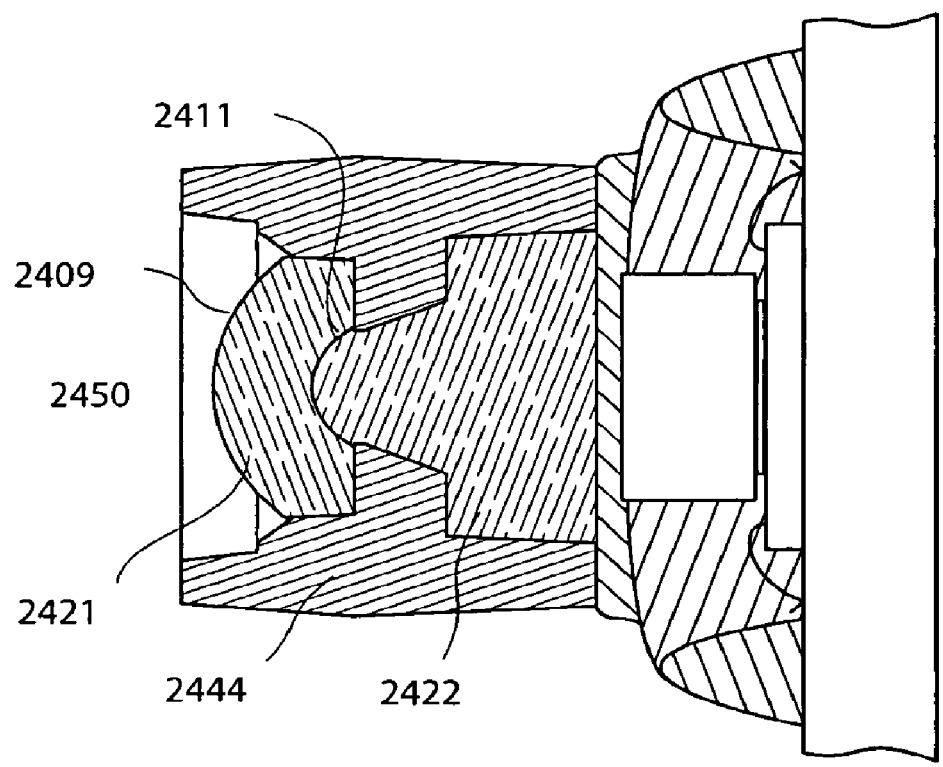
FIGS. 24 and 25 depict various embodiments of improved optical structures.

A dual lens structure having two compound lenses has been used in most of the exemplary embodiments because the lens structures presented embody special features which enable two or more multiple element lens systems to be placed in very close proximity one to another. FIG. 24 illustrates a single lens system lens structure which embodies many of the features of this invention. It is included to illustrate that many of the features of this invention apply to single lens structures and these single lens structures are part of this invention.

Figure 25:
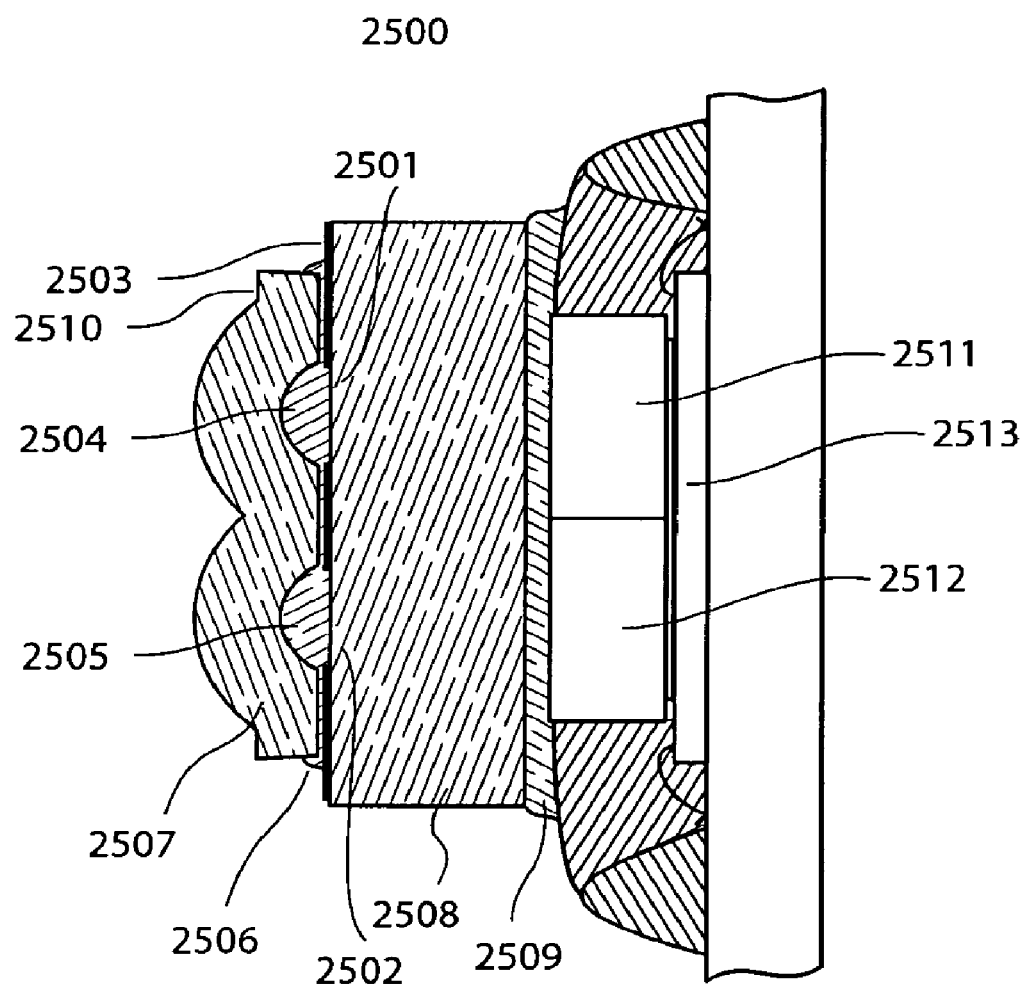
Figure 26:
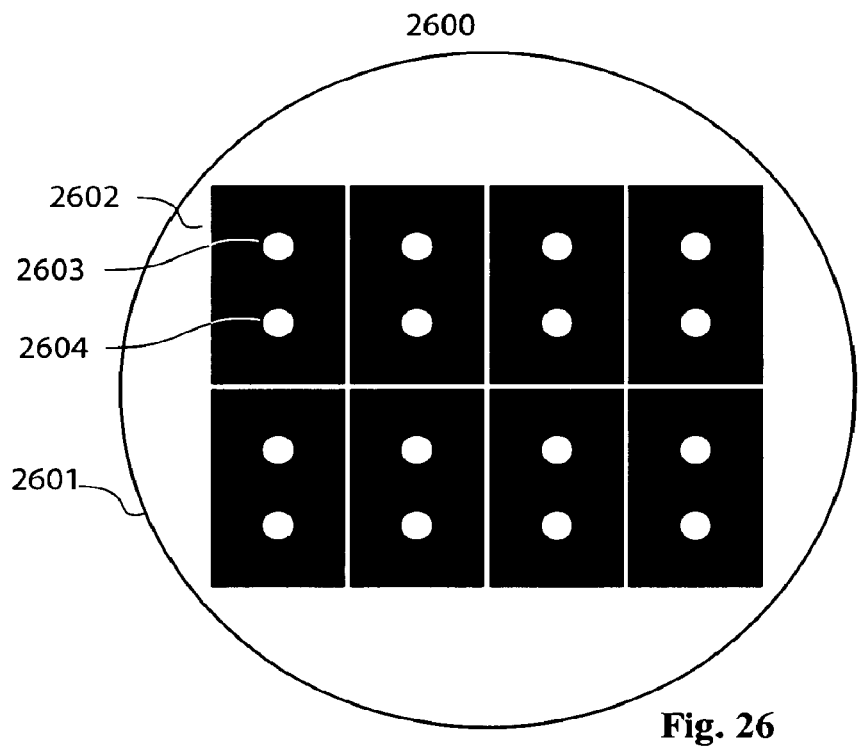
FIGS. 26 and 27 depict various embodiments of an improved optical structure with a lens and an aperture mask.
Figure 27:
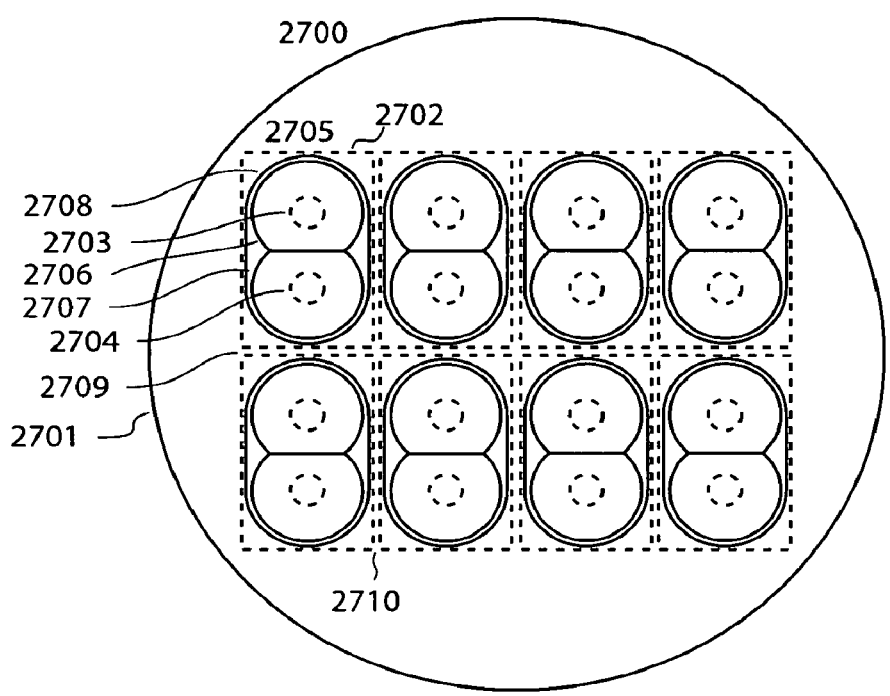

The construction detailed in FIGS. 25 through 27 is a variant of the construction which is detailed in FIG. 16. In the construction of FIG. 25, lens structure 2507 is similar to and in fact may be identical to lens structure 1621 of FIG. 16. A transparent glue (preferably with optical properties similar to the glue used to cast lens member 1622 of FIG. 16) which is cast in place at 2504 and 2505 serves the same optical functions to create the color corrected compound lens structures as does the glue in member 1622 of FIG. 16. In FIG. 25, the supporting member and aperture structure 1644 of FIG. 16 has been removed and a member 2508 which is preferably optically clear has been added. Member 2508 includes an aperture stop 2503 which is preferably coated on its surface. The glue which serves as lens elements at 2504 and 2505 also fills the void between lens member 2507 and transparent substrate member 2508 and adheres to their surfaces serving to glue or fasten them together. In a preferred structure, the block 2500 is made of ordinary soda lime glass or optionally of Schott Borofloat33©. When the optical characteristics are fairly close to that of the glue, as they are with the glass or Borofloat33©, very little change in the lens prescriptions is needed to move from the structure of FIG. 16 to the structure of FIG. 25 except that the focal distance is preferably adjusted for best focus with the changed materials in the optical path.

One advantage of the structure of FIG. 25 is that the volume of the glue has been significantly reduced. An issue with many of the optically clear glues is that they shrink considerably on hardening, particularly with the convenient to use ultraviolet cure varieties. With many of the glues, the creation of voids and separation at the glue surface is a problem because of this shrinkage. These problems may be minimized by characterizing with the UV light exposure pattern and intensity for UV cured glues and by characterizing the temperature and temperature/time profile for thermally cured glues. For example, with UV cure, it may be preferable to pattern the UV light source so that the center area receives the strongest exposure causing curing to begin generally from the central area optionally between the lens systems or generally along the optical axis of each lens system and to progress outward toward the outer boundaries of the glue layer so that additional glue can be drawn in from around the edges of the part as shrinkage takes place during the curing process. In certain embodiments, it is advantageous to direct some of the light used for curing the lens material through the lens aperture to allow a higher concentration of the curing light to strike the area which is generally along the optical axis of the lens member/s which are being cured. In this way curing may be induced earlier in these areas. In so doing, an unrestricted path is provided to allow the uncured glue to flow to fill volume where shrinkage takes place during the curing process. Other patterns of curing may be used to provide paths for glue to flow from the boundaries of the uncured volume of glue to fill in space created by shrinkage of the glue as it cures. Through much of the specification, the curing light has been referred to as ultra violet or UV. It is an option of this invention to substitute glues which cure at visible or other wavelengths or possibly at a combination of wavelengths or even to substitute glue which cures due to heat generated by wavelengths such as infrared. Although it does not entirely eliminate the problem, the reduced volume of glue in the configuration of FIG. 25 substantially reduces the problem. With some configurations, small projections may be added to the back of the lens structure 2507 to serve as standoffs between parts 2507 and 2508 to control the thickness of the glue layer 2506 between the parts.

A particular advantage of the construction of FIG. 25 is that many copies of the aperture masks for many parts may be applied simultaneously on a single substrate and these may optionally be singulated or cut apart either before or after application of individual lens element structures to each of the aperture masks. With the small parts, this process lends itself to adaptation of equipment used in microelectronics assembly to perform the various fabrication and assembly processes. By using a Teflon® tip on a dispensing needle, the glue used to form portions 2504, 2505, and 2506 of the lens assembly may be dispensed into the lens cavities on the back of member 2507 while this back surface is facing downward and the surface tension and stronger attraction of the glue to the lens material than to the Teflon® tip will cause the glue to preferentially adhere and transfer to the under side of lens member 2507. This is an option during the fabrication process which may eliminate the added machine complexity which would otherwise be required to turn the part over to apply the glue.

FIG. 26 is a simplified view of a substrate assembly 2600 comprising a transparent substrate member 2601 and masks for a number of lens assemblies. 2602 is a representative mask with aperture openings 2603 and 2604. This view is simplified for illustrative purposes and, for example, masks for 1000 parts might be included on a single substrate.

Optionally, the filters may be placed on substrate 2600 so that, for example, aperture opening 2603 might contain the red filter and, optionally, the integral infrared reject filter and aperture opening 2604 might contain the red complement filter and, optionally, the integral infrared reject filter. As a further option, when the filters are moved to member 2508, 2508 might be thickened so that it can replace glue layer 2509 and filter and imager cover sections 2511 and 2512. When this option is exercised, block 2501 must be sized to fit on the surface of the wafer and to clear the lead bond connections in order to serve as a window for the wafer assembly. Focus may be established by placing tight tolerances on parts, or optionally by adjusting the thickness of glue layer 2506 and/or of glue layer 2513.

In FIG. 27, the finished assembly 2700 is illustrated. Substrate 2701 contains an array of masks to which lens assemblies have been attached. 2705 is a representative one of these substrate masks with the attached lens assembly. Lens assembly 2708 is aligned to aperture openings 2703 and 2704 of mask 2702. The lens element pair 2706 preferably includes a flange 2707 which may be engaged by a vacuum pickup to facilitate handling and positioning of the lens assembly during alignment and assembly operations. As previously indicated the vacuum pickup tool is preferably provided with a transparent window to allow viewing of the part to position it during the assembly process. The parts may be singulated using a wafer saw, cutting along rows and columns along the boundaries of the individual parts of which 2709 is representative.

The aperture masks are preferably minimally reflecting. The need for minimal reflectance and the resulting minimization of scattered light in the lens system is dependent on the problems which stray light reflections cause in the intended application. Chrome masks are generally available and may be produced by process in which the chrome layer is deposited on a transparent substrate; coated with a photo-resist; exposed to the desired pattern and developed and etched to produce the desired mask. One of the options for these masks is to use chrome in a multiple layer stack which has been formulated to reduce its reflectance. A process similar to this may be used to produce masks having tight tolerances and relatively low reflection for the aperture masks of FIGS. 25-27. Other options for the fabricating the masks include the use of various printing processes including the use of inks with screen printing, pad printing, or inkjet printing. Laser oblation may optionally be used to clear the mask material from the aperture area. The laser needs to be used with caution and control to avoid damage to the substrate window and to produce a clean, transparent window area. There are also various photo resists which are generally nonreflecting and may produce either a positive or optionally a negative image of the exposed area. Such masks may optionally be applied to serve as the pattern of aperture stops for the lens assemblies.

In an alternate construction, all or a portion of the aperture mask may be placed on the back of lens member 2507 and optionally a portion of the aperture mask may also be patterned on substrate member 2508. The advantage of this construction is that a pad printing process may be used in which the ink is transferred from a pad having a preferably modest compliance to the back surface of part 2507 by simply lightly pressing the part 2507 against the pad having a very thin layer of ink to portions of the part which contact the ink coated pad and then curing the ink. Alternately, the pad may be pressed against the part. The process has a first advantage that it is or may be self aligning in that it may be configured to eliminate or simplify the critical alignment step to satisfactorily register the mask to the lens surfaces of lens member 2507. Secondly, the edge of the lens surfaces on the back of lens member 2507 may be covered by the mask material in the process thereby minimizing troublesome optical distortion which would otherwise result from light being projected through these surfaces and falling onto the image. Third, there is more latitude in changing the thickness of glue layer 2506 to adjust focus and also more latitude to adjust rotation and alignment of the lens member 2507 to adjust registration of the projected image on the imaging array of member 2513. Then as a further option, block 2508 and glue layer 2509 may be eliminated by appropriate thickening of filter and/or cover glass assembly which are represented by 2511 and 2512 in FIG. 25 to preserve the needed focal distance.

In the mask printing process just described, the lens member 2507 contains geometric features which are used in the aperture mask fabrication process to at least in part determine the shape and position of boundaries of the aperture mask.

Figures 31, 32:
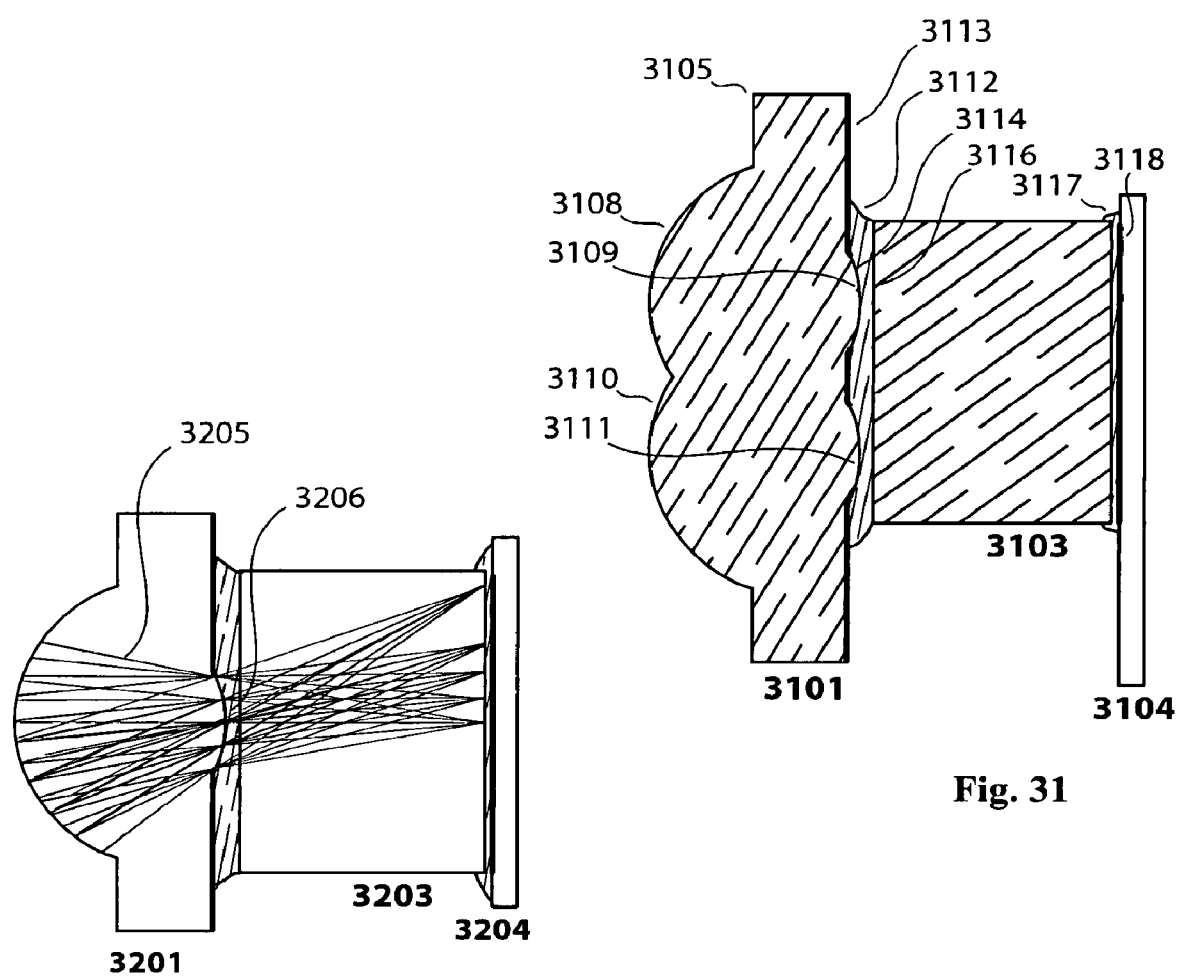
FIGS. 31 and 32 depict various views of an image sensor having an improved optical structure.
Figure 33:
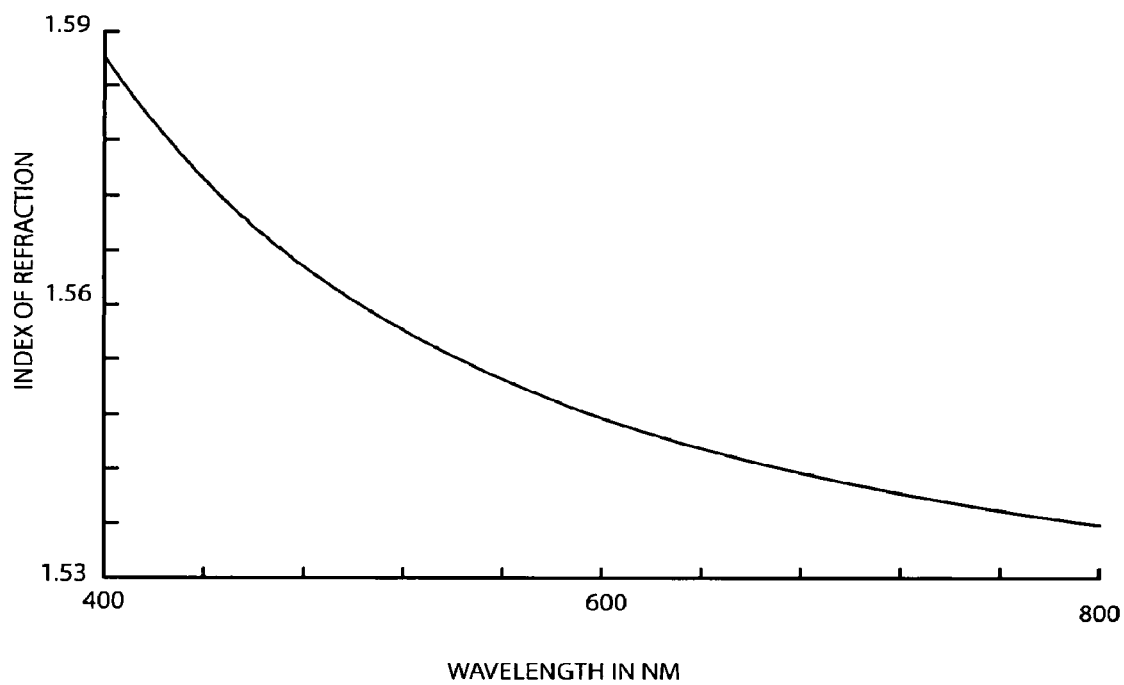
FIG. 33 depicts a graph of index of refraction v. wavelength for a glue utilized in an improved optical structure.

Two variants of an alternate construction are depicted in FIGS. 28 through 32. These designs are optically similar to the design of FIG. 4 in that a high Abbé number low dispersion material is used for the lens which is nearest to the scene. In FIG. 4, a second lens element member 422 is made of a high dispersion low Abbé number material and has lens surfaces molded into it. In the design of FIG. 4, the glue which fills space 424 is optically similar to the material of lens member 421 so that the more powerful lens interface is between glue layer 424 and the lens surface 425 which is molded in the optically dissimilar low Abbé number lens member 422. The relative disadvantage of the design in FIG. 4 is that lens members 421 and 422 each have lens surfaces which must be molded and aligned one to another. In the lens structures depicted in FIGS. 28 through 32, the higher Abbé number glue 424 of FIG. 4 has been replaced by a higher dispersion, low Abbé number, glue 2812 in FIG. 28 and glue 3112 in FIG. 31. With this modification, the lens interfaces between the lower dispersion, higher Abbé number molded lens and the conforming surface of the higher dispersion, lower Abbé number, glue layer are effective to significantly improve color correction and significantly expand the field of view over which lens aberrations are substantially reduced. With the effective lens surface provided at the glue interface, the need for molded lens surfaces in another lens element is reduced. Thus, member 2802 is preferably flat so that lens surfaces do not have to be molded into this member and the more critical alignment steps required between members each having active lens surfaces is eliminated. In the structure of FIGS. 31 and 32, even the flat member 2802 of FIG. 28 is eliminated.

Cleaning processes such as argon ion bombardment may be used to enhance glue adhesion. In the design of FIGS. 28 through 30, a flat, preferably plastic, substrate member 2802 is used to provide a surface on which to glue lens member 2801. The aperture depicted as darkened line 2813 in FIG. 28 and as 3010 in FIG. 30 is placed on the substrate member in FIGS. 28 through 30. Optionally this aperture may be placed directly on the back of lens member 2801 as it is for lens member 3101 in FIG. 31. It should be understood that FIGS. 28 through 32 represent simplified designs to which additional features including those depicted in FIG. 4 or 25 may be readily added. One of the lens structures of FIGS. 28 through 32 may be generally substituted for the lens structure of FIG. 4. Then application of the filter, baffle, interconnections, and packaging described in FIG. 4 may be applied using one of the lens structures of FIGS. 28 through 32.

The lens elements formed in glue layers 2812 and 3112 of FIGS. 28 and 31 have negative focal lengths and the index of refraction of both the acrylic molded lens elements and of the glue layers in these exemplary designs decreases with increasing temperature, the overall rate of decrease being greater for the glue than for the acrylic. The rates of change of focal length with changes in temperature for the lens systems of FIGS. 28 through 32 are less than the comparable rates of change of focal length with changes in temperature for acrylic lenses of comparable focal length. Thus, the lens structures do utilize the greater rate of change of the index of refraction of the glue with changes in temperature to produce a partial compensating effect thereby reducing the rate of change in focal length with changes in temperature for the lens system. The lens formed at the glue interface is also effective to substantially improve color correction and also to substantially reduce lens aberrations over an extended field of view.

With reference to FIG. 28 a lens member 2801 is preferably molded from a low dispersion, high Abbé number plastic, for example, a preferably high temperature grade of acrylic or a cyclic olefin copolymer. Glue layer 2812 preferably has a high dispersion, low Abbé number, and may for example be a UV curable grade of epoxy. Measurements of Abbé Number for a UV curable epoxy glue referred to herein as 9JS7 indicated that the glue has a low Abbé number in the range of 30 (The sample was measured at 27.3) which is unusually low for a UV curable epoxy and is in the range of the Abbé number for polycarbonate. The glue exhibits good adhesion and generally performs well when subjected to temperature cycling and elevated humidity testing. One undesirable characteristic is that in thicker sections, the 9JS7 material has a modest yellow cast. The low Abbé number is especially desirable because the glue functioned well in the designs in FIGS. 28 through 32 to reduce the shift in focal length of the lens structure due to temperature variation while at the same time substantially reducing color aberrations and also substantially increasing the field of view for which lens aberrations were reasonably low. The formulation of 9JS7 comprises 10 parts Dow 354 (bisphenol F diglycidyl ether—available from Dow Chemical Corp.), 0.05 parts Dow Z-6040 (gamma-glycidoxy propyl trimethoxy silane—available from Dow Chemical Corp.) and 0.2 parts Dow UVI-6992 (blend of di and tri aryl sulfonium phosphate salts—available from Dow Chemical Corp.) Another version of this formula referred to herein as 16SM55, employs Dow UVI-6976 (a blend of di and tri aryl sulfonium antimonate salts—available from Dow Chemical Corp.) in lieu of Dow 6992. The antimonate salt is a stronger acid and assists in a more complete cure of the glue. It should be understood that these glue formulas may also be used to attach an associated filter glass to the image sensor die.

In further testing, it was discovered that by keeping the same resin backbone structure used in the 9JS7 and 16SM55 formulations, the low Abbé number desired for the application may be maintained while reducing the yellow coloration and maintaining satisfactory environmental performance. A preferred formulation is referred herein by 9JS31H and comprises a mixture of 50% 10 parts 354, 0.05 parts Z6040 and 0.05 parts UVI-6976 (0.5%) combined with 50% of 10 parts 354, 0.05 parts Z6040 and 0.10 parts UVI-6992 (1%).

Substrate member 2802 may be fabricated from a strip or sheet of clear polycarbonate. The glue in layer 2815 may, for example, be Dymax 429. Use of the substrate member 2802 has several benefits. The glue layer 2812 may be cured before focus and alignment of the lens so that these steps may be performed with the lens elements formed in layer 2812 having optical properties of their final cured state. The focus and alignment step may be accomplished by applying glue layer 2815, then focusing and aligning the lens, and then curing glue layer 2815. The glue material in glue layer 2815 may be selected based on satisfactory optical transmission, environmental resistance, adhesive properties without additional specifications on Abbé number etc. needed for the layer 2812 which forms an active lens surface which is used for color correction and reduction of other aberrations. The flat member 2802 provides a flat exit surface for the lens subassembly formed by lens 2801, glue layer 2812, and flat, transparent member 2802. The material in member 2802 is preferably selected for good high temperature resistance, good glue adhesion characteristics and so that it has an expansion coefficient which approximately matches that of lens member 2801 as polycarbonate, for example, does. Then 2802 serves as a thermal expansion buffer between the low expansion window 2803 and the potentially more fragile adhesion of glue layer 2812 and potentially less high temperature resistant lens member 2801. Optical window 2803 serves a purpose similar to that of window structure 442 of FIG. 4. The thickness is preferably chosen to provide for appropriate focal distance and for appropriate thickness of glue layer 2815. Color filters as described in relation to filter 442 of FIG. 4 or as described in relation to the filter design in relation to FIG. 13 are preferably provided on surface 2816 of window structure 2803. The imaging integrated circuit 2804 includes imaging array 2818. The window assembly 2803 is preferably glued to the array using transparent glue and is positioned so that the area covered by the window includes the active imaging array. For imaging arrays which include a micro-lens array to focus light on the sensitive areas of individual pixels, the cover window may be sealed around its edge and an area filled with dry air or other gas may be provided between the cover glass and the image sensing area 2818 of the imager 2804. For more details on attachment of the imager chip 2804 to the circuit board, wire connections, and encapsulation of the chip, refer to FIG. 4 and to other references contained elsewhere herein. In FIG. 28, flange 2805 may be used with a vacuum pickup tool to handle the lens during assembly and adjustment operations. Optionally, additional features may be added to the lens to facilitate accurate positioning of the lens relative to a gripping mechanism. The aperture 2813 is depicted as being applied to preferably flat member 2802 and is also shown as 3010 in FIG. 30. Optionally, the aperture mask may be printed on the back of lens member 2801. The lens structure incorporates two approximately parallel compound lens systems, one for which rays enter lens surface 2808 and pass through lens surface 2809 and the associated aperture opening, through the conforming lens element formed in glue layer 2812, through the associated filter section of filter layer 2816, through window member 2803, through glue layer or optional air or gas space layer 2817, and finally are focused on the upper portion of imaging array 2818. For the second lens structure or the assembly, rays enter lens surface 2810 and pass through lens surface 2811 and the associated aperture opening, through the conforming lens element formed in glue layer 2812, through the associated filter section of the filter layer 2816, through window member 2803, through glue layer or optional air space layer 2817, and finally are focused on the lower portion of imaging array 2818. Member 2806 is one of several raised areas provided to establish the spacing between members 2801 and 2802 to establish the thickness of glue layer 2812 and its associated lens structure. The assembly of FIG. 28 depicts two compound lens systems. Many of the features of the structure may be applied to fabricate a single compound lens system in which case FIG. 29 may serve as both a top and as a general side view or features of the structure may also be used to fabricate a structure with 3 or more compound lens systems.

FIG. 29 is a top view of the lens structure of FIG. 28 which indicates ray traces 2905 for light sources placed at 0°, 5°, 10°, 15°, and 25° relative to the central axis of the lens. These rays pass through internal lens surface 2906 and its associated aperture. Lens 2901, window 2903, and imager 2904 are side views of their respective counterparts 2801, 2803, and 2804 of FIG. 28.

The preferably, approximately flat member 2802 of FIG. 28 is preferably fabricated as a section of a strip of similar parts as illustrated in FIG. 30. Areas 3003, 3002, and 3001 are each for placement of a lens and are shown as a progression of fabrication steps. At 3001, a partial outline cutout has segments 3005 and 3007 which partially surround the desired finished part. Areas 3006 and 3012 serve to retain the piece in the carrier strip and are preferably left in place so that the tape may serve as a carrier strip until being cut away to separate the lens from the strip as part of the final assembly process. At 3002, the aperture mask 3010 with aperture openings 3009 and 3011 has been applied preferably by printing it on the substrate member 3002. This mask may optionally be applied to the back of lens 2801. At 3003, a lens 3008 has been aligned and glued in place forming the assembly as depicted by members 2801, 2812, and 2802 of FIG. 28.

The lens assembly in FIG. 31 is similar to that of FIG. 28 except that substrate member 2802 has been removed; window 2803 has been thickened to maintain the proper focal distance; the spacing projections 2806 have been removed; the aperture mask 3113 has been placed on the back of lens element member 3101; the lens element parameters and diameters have been modestly adjusted to accommodate the new aperture position; and, glue layer 3112 now serves both to form lens element surfaces which conform to surfaces 3109 and 3111 of molded lens member 3101 and also to provide for adjustment of lens alignment and focus before being cured. For most glue materials, curing of the glues results in a significant increase in the index of refraction of the glue material. In the design of FIG. 31, the change in focal length as the glue cures is preferably taken into account when focusing is accomplished while glue layer 3112 is in its uncured state. One method is to place a compensating lens between the lens assembly of FIG. 31 and the target used for focusing and select the compensating lens so that optical performance of the system with the compensating lens and the uncured glue nearly matches the optical performance of the system after the glue is cured and the compensating lens is removed.

The compound lens systems with entrance surfaces 3108 and 3110 are ideally optimized for the specific ranges of wavelengths which are transmitted by their associated color filters but with the relatively good correction inherent in the design should be very close to one another and may reasonably and optionally be designed to the same prescription. Lens system parameters are in millimeters and specified in the form used by the ZEEMAX® program. Lens element thicknesses are specified along the center axis of the lens system. Surface 3108 is an even asphere and has a nominal radius of 1.858 mm, a coefficient of $r^4$ of −0.0044, a coefficient of $r^6$ of −0.001, a coefficient of $r^{12}$ of −3e-006, a coefficient of $r^{14}$ of −3e-006, and a coefficient of $r^{16}$ of −3.8e-006, and the acrylic lens element thickness from 3108 to 3109 is nominally 2.57 mm. In the preferred designs, aspheric coefficients and conic constants which are not specified are assumed to be zero. Here, the thickness of the lens element with the higher Abbé number is greater than the radius of the front lens surface. This turned out to be a good balance in the lens design and is one of the factors which enables the lens surface at the interface between the material of higher and lower Abbé numbers to provide color correction while enlarging the field of view over which relatively low lens system aberrations are maintained. Acrylic back lens surface 3109 is an even asphere with a radius of −1.9 mm and a coefficient of $r^4$ of −0.145. The glue layer between acrylic back lens surface 3109 and the front surface 3116 of the filter and cover glass assembly 3103 is adjusted for best focus and is nominally 0.25 mm. The nominal thickness of the polycarbonate lens block 422 measured from the center of lens surface 425 is 1.825 mm. The nominal thickness of glue layer 3112 is 0.25 mm and varies in accordance with the results of the lens alignment and focusing procedure. The nominal diameter of the lens apertures is 1.22 mm and the diameters of molded lenses 2809 and 2811 are preferably made a little larger, 1.32 mm for example, so that some misalignment and diameter tolerance is available to preferably keep the edge of the lens surface covered by the aperture mask. The nominal index of refraction of the glue is 1.549 and the nominal Abbé number of the glue is 27.3. The nominal thickness of the filter and cover glass assembly 3103 is 2.9 mm. The cover glass material is preferably Borofloat33. The surface of the imager is very close to the cover glass and is preferably also glued to the cover glass. The thickness of the cover glass is preferably adjusted to maintain the desired thickness range for the glue layer 3112 when the lens is properly focused. With the design just described the front lens surface 3108 for the one lens system and 3110 for the other lens system are the only material to air interfaces in the optical paths of the lens systems. That is, each lens system has only one surface with an air interface in the path from the first surface of the lens system through to the imager. This construction for which each compound lens system has multiple active optical surfaces with only one surface which interfaces with air helps to minimize surface contamination and reduces surface reflections without the need for antireflection coatings at the non-air interface surfaces. The index holes 3104 are provided to position the strip using a feed mechanism. FIG. 32 illustrates a top view of the lens structure shown in side view in FIG. 31 and includes ray traces 3205 similar to those shown in FIG. 29 for the lens construction of FIG. 28.

What is claimed is:

1. An image acquisition system, comprising:
a lens structure configured to project an image on an image surface of an image sensor, said lens structure comprising a compound lens, said compound lens comprising at least a first and a second lens element each comprising at least one substantially non-planar lens surface, said first and second lens elements comprising different lens materials, said first and second lens elements are in direct contact with one another, such that there is no interposing material, such as a glue layer, an air gap, or any other imposing material therebetween, wherein said first and second lens elements are configured to function in combination to at least partially correct chromatic aberration.

2. The image acquisition system as in claim 1 said first lens element comprising acrylic.

3. The image acquisition system as in claim 1 said first lens element comprising polycarbonate.

4. The image acquisition system as in claim 1 further comprising an aperture mask between said first lens element and said image sensor.

5. The image acquisition system as in claim 1 further comprising a diffuser configured to uniformly set the width of diffusing to approximately equal a center-to-center spacing of adjacent pixels of said image sensor measured in the direction of said diffusing.

6. The image acquisition system as in claim 1, wherein said first lens element is further away from said image sensor than said second lens element, said first lens element comprising a material with a higher Abbé number than said second lens element.

7. The image acquisition system as in claim 6 said first lens element comprising a scene side convex surface and an image sensor side convex surface.

8. The image acquisition system as in claim 6, wherein a thickness of said first lens element is greater than a scene side surface radius thereof.

9. The image acquisition system as in claim 1, wherein said first lens element is further away from said image sensor than said second lens element, said first lens element comprising a material with a lower Abbé number than said second lens element.

10. The image acquisition system as in claim 9 said first lens element comprising a scene side convex surface and an image sensor side concave surface.

11. The image acquisition system as in claim 9, wherein a thickness of said first lens element is less than a scene side surface radius.

12. The image acquisition system as in claim 1 that is substantially free of air gaps between said lens elements and said image surface.

13. The image acquisition system as in claim 1 further comprising a red spectral filter between said first compound lens and said image sensor.

14. The image acquisition system as in claim 13 further comprising a red compliment spectral filter between said second compound lens and said image sensor.

15. The image acquisition system of claim 1, wherein a change in an index of refraction of said second lens element is greater than a change in an index of refraction of said first lens element over a given temperature range.

16. The image acquisition system of claim 1, wherein an index of refraction of said first lens element changes more quickly as a function of temperature than an index of refraction of said second lens element.

17. An image acquisition system, comprising:
a lens structure configured to project an image on an image surface of an image sensor, said lens structure comprising:
a compound lens comprising:
a first lens element; and
a second lens element, wherein each of said first and second lens elements comprise at least one substantially non-planar lens surface and different lens materials, said first and second lens elements are configured to function in combination to at least partially correct chromatic aberration, wherein a change in an index of refraction of said second lens element is greater than a change in an index of refraction of said first lens element over a given temperature range, and an index of refraction of said first lens element changes more quickly as a function of temperature than an index of refraction of said second lens element thereby reducing a change in focal length of said compound lens over said temperature range.

18. An image acquisition system, comprising:
a lens structure configured to project an image or an image surface of an image sensor, said lens structure comprising:

a compound lens comprising:
   a first lens element;
   a second lens element, wherein each of said first and second lens elements comprise at least one substantially non-planar surface and different lens materials, said first and second lens elements are configured to function in combination to at least partially correct chromatic aberration; and
   an aperture mask between said first lens elements and said image sensor.

19. The image acquisition system of claim 18, wherein said first lens element is further away from said image sensor than said second lens element, said first lens element comprising a material with a higher Abbé number than said second lens element.

20. The image acquisition system of claim 18, wherein said first lens element is further away from said image sensor than said second lens element, said first lens element comprising a material with a lower Abbé number than said second lens element.

* * * * *

UNITED STATES PATENT AND TRADEMARK OFFICE
CERTIFICATE OF CORRECTION

PATENT NO. : 7,599,134 B2  Page 1 of 3
APPLICATION NO. : 12/180762
DATED : October 6, 2009
INVENTOR(S) : Jon H. Bechtel et al.

It is certified that error appears in the above-identified patent and that said Letters Patent is hereby corrected as shown below:

Column 1
Line 37, after "of" insert --an--.
Line 38, "structure" should be --structures--.
Line 43, "structure" should be --structures--.
Line 45, after "of" insert --an--.
Line 60, "DETAIL" should be --DETAILED--.

Column 6
Line 4, "focal" should be --focal length--.
Line 20, "focal" should be --focal length--.
Line 37, after "of" delete "for".
Line 38, "verses" should be --versus--.
Line 56, "with variation" should be --due to--.

Column 7
Line 20, "in to" should be --in two--.
Line 62, "(i.e.)" should be --i.e.--.

Column 8
Line 3, "directions" should be --direction--.
Line 5, "set" should be --so--.

Column 9
Line 24, "are" should be --is--.
Line 57, "characteristic" should be --characteristics--.

Column 11
Lines 10 and 11, "assume a generally conical shape" should be --assumes a generally conical shape--.
Line 42, "tends" should be --tend--.
Line 54, "tends" should be --tend--.
Line 62, "tend" should be --tends--.

Signed and Sealed this

Fifteenth Day of June, 2010

David J. Kappos
*Director of the United States Patent and Trademark Office*

Column 12
Line 35, "disclose" should be --disclosed--.
Line 49, "vehicles" should be --vehicle's-- (2nd occurrence).
Line 60, "assembly" should be --assemblies--.

Column 13
Line 8, "maybe" should be --may be--.
Line 19, "comprise" should be --comprising--.

Column 14
Line 63, after "409" insert --and--.

Column 15
Line 3, "pass-through" should be --pass through--.
Lines 24 and 25, "Zeemax Development Corporation" should be --ZEMAX® Development Corporation--.
Line 36, "Schott Borofloat33©" should be --Schott Borofloat® 33--.
Line 45, "ZEEMAX®" should be --ZEMAX®--.

Column 17
Line 47, after "described" delete "these".

Column 18
Lines 18 and 19, "Fig. 4 show in" should be --Fig. 4 is shown in--.
Line 21, after "lens" insert --surfaces--.
Line 31, after "a" delete "the".

Column 21
Line 44, "ZEMAX" should be --ZEMAX®--.
Line 48, "distinguish" should be --distinguished--.
Line 57, after "red filter" insert --,--.

Column 23
Line 3, "distances" should be --distance--.

Column 24
Line 61, "were" should be --where--.

Column 26
Line 37, after "1609" insert --and--.
Line 45, "pass-through" should be --pass through--.
Line 66, "Zeemax Development Corporation" should be --ZEMAX® Development Corporation--.

Column 27
Line 56, "Schott Borofloat33®" should be --Schott Borofloat® 33--.

Column 28
Line 3, "ZEEMAX®" should be --ZEMAX®--.
Line 56, "are" should be --is--.

Column 29
Lines 7 and 8, "(This will vary when proper focus is set.)." should be --(This will vary when proper focus is set).--.
Line 19, "material" should be --materials--.

Column 30
Line 38, "approached" should be --approach--.
Line 40, "Fig." should be --Figs.--.
Line 43, "to a lens" should be --to lens--.

Column 31
Line 60, "Zemax" should be --ZEMAX®--.
Line 66, "illustrates" should be --illustrate--.

Column 33
Lines 17 and 18, "strike the lens system illuminate" should be --strikes the lens system illuminates--.

Column 34
Line 64, "of Schott Borofloat33©" should be --of Schott Borofloat® 33--.
Line 66, "Borofloat33" should be --Schott Borofloat® 33--.

Column 36
Line 37, after "by" insert --a--.
Line 45, after "fabricating" insert --of--.

Column 38
Line 23, "Number" should be --number--.
Line 26, "(The" should be --(the--.
Line 44, after "Corp.)" insert --.--.

Column 40
Line 56, "ZEEMAX®" should be --ZEMAX®--.

Column 41
Line 23, "Borofloat33" should be --Schott Borofloat® 33--.

Column 42
Claim 14, line 2, "compliment" should be --complement--.